United States Patent [19]
Williams

[11] Patent Number: 5,973,367
[45] Date of Patent: *Oct. 26, 1999

[54] MULTIPLE GATED MOSFET FOR USE IN DC-DC CONVERTER

[75] Inventor: Richard K. Williams, Cupertino, Calif.

[73] Assignee: Siliconix incorporated, Santa Clara, Calif.

[*] Notice: This patent is subject to a terminal disclaimer.

[21] Appl. No.: 08/828,474

[22] Filed: Mar. 31, 1997

Related U.S. Application Data

[63] Continuation-in-part of application No. 08/542,611, Oct. 13, 1995, Pat. No. 5,616,945.
[51] Int. Cl.$^6$ .............. H01L 29/76; H01L 29/94
[52] U.S. Cl. ............ 257/365; 257/133; 257/153; 257/167; 257/172; 257/296; 257/327; 257/335; 257/366
[58] Field of Search ................ 257/133, 153, 257/167, 172, 296, 327, 335, 365, 366

[56] References Cited

U.S. PATENT DOCUMENTS

| | | | |
|---|---|---|---|
| 3,660,697 | 5/1972 | Berglund et al. | 307/304 |
| 4,445,202 | 4/1984 | Geotze et al. | 365/182 |
| 5,616,945 | 4/1997 | Williams | 257/365 |

OTHER PUBLICATIONS

Richard K. Williams et al., "Optimization of Complementary Power DMOSFETs for Low–Voltage High–Frequency DC–DC Conversion", IEEE Advan. Power Elec. Conf., APEC, May 1995, Dallas Texas, pp. 765–772.

Richard K. Williams et al., "High–Frequency DC/DC Converter for Lithium–Ion Battery Applications Utilizes Ultra–Fast CBiC/D Process Technology", 1995 IEEE, pp. 322–332.

*Primary Examiner*—Valencia Martin-Wallace
*Attorney, Agent, or Firm*—Skjerven, Morrill, MacPherson, Franklin & Friel LLP; David E. Steuber

[57] ABSTRACT

A power MOSFET includes a pair of electrically isolated gates having different gate widths. The MOSFET is connected in a switching mode DC-DC converter, with the gates being driven by a pulse width modulation (PWM) control to vary the duty cycle of the gate drive signal and thereby regulate the output voltage of the DC-DC converter. In light load conditions, the larger gate is disconnected from the PWM control to reduce the gate capacitance which must be driven by the PWM control. In normal load conditions, the larger gate is connected to the PWM control to reduce the on-resistance of the MOSFET. Both of these operations increase the efficiency of the DC-DC converter.

19 Claims, 37 Drawing Sheets

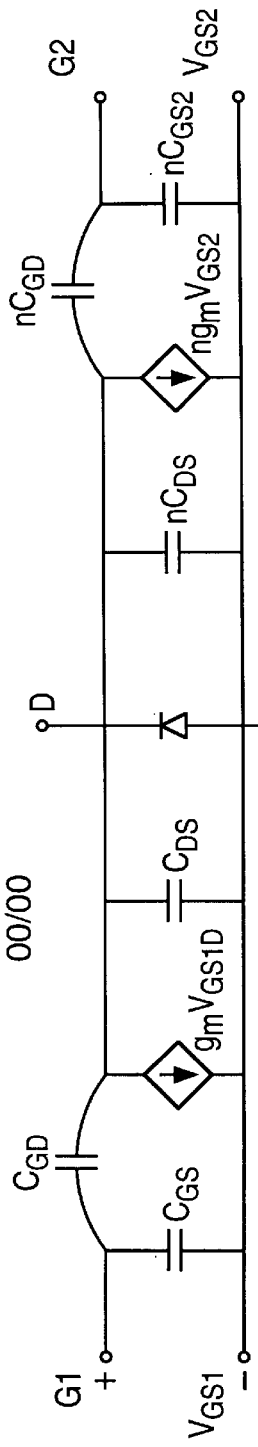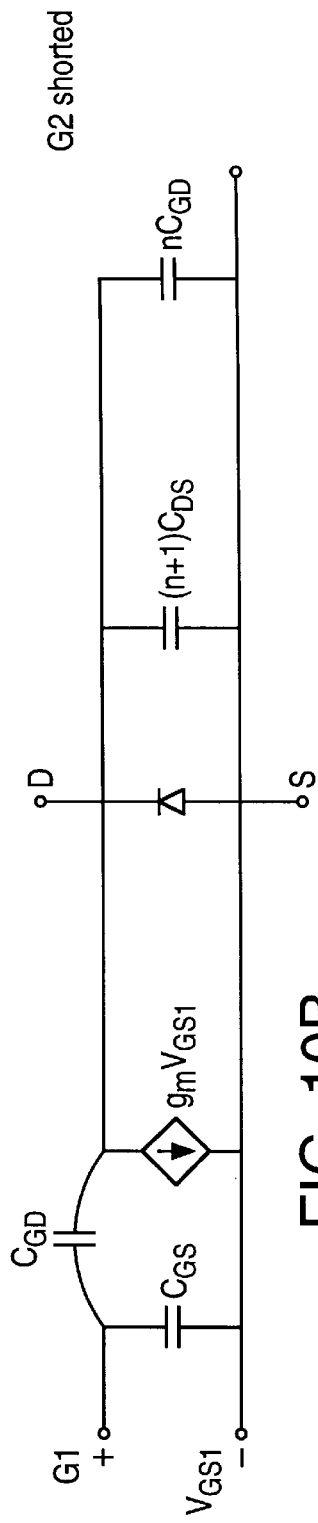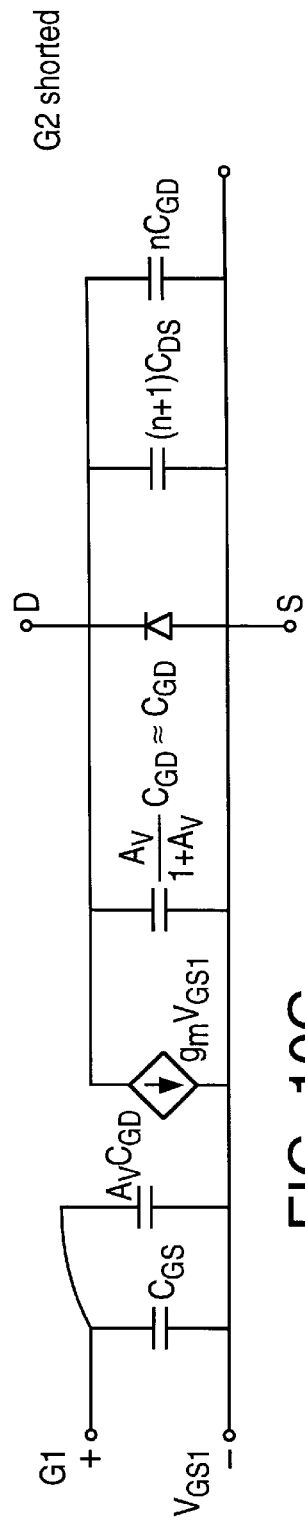

MULTIPLE GATED MOSFET FOR USE IN DC-DC CONVERTER

REFERENCE TO PRIOR APPLICATION

This application is a continuation-in-part of application Ser. No. 08/542,611, filed Oct. 13, 1995, now U.S. Pat. No. 5,616,945, issued Apr. 1, 1997.

FIELD OF THE INVENTION

This invention relates to DC-DC converters and in particular to a multiple gated MOSFET that is well suited for use in DC-DC converters.

BACKGROUND OF THE INVENTION

DC-DC converters are used to convert an input DC voltage to an output DC voltage. In one class of DC-DC converters, known as switching mode converters, the output voltage is determined by the duty cycle of a switch to which the input voltage is applied.

An example of a switching mode DC-DC converter is the complementary synchronous buck converter 10 shown in FIG. 1. A complementary pair of MOSFETs M1 and M2 are connected in series between the input voltage $V_{in}$ and ground, P-channel MOSFET M1 serving as a series switch and N-channel MOSFET M2 serving as a shunt switch. The common node between MOSFETs M1 and M2 is connected through a low-pass filter including an inductor L1 and a capacitor C1 which deliver the output voltage $V_{out}$ to the load. $V_{out}$ is fed back to a pulse width modulation (PWM) control 12, which supplies a PWM signal to the gates of MOSFETs M1 and M2. $V_{out}$ is determined by the duty cycle of the PWM signal, i.e., in this case the percentage of the time during each cycle that the PWM signal is low, thereby turning P-channel MOSFET M1 on. PWM control 12 is controlled by the feedback path to maintain $V_{out}$ at a desired level.

DC-DC converters are available in a wide variety of topologies. FIG. 2 shows a totem pole N-channel synchronous buck converter 20, in which $V_{out}$ is determined by the duty cycle of high segment of the PWM signal applied to the gate of N-channel MOSFET M3. PWM control 22 supplies time delayed signals to the respective gates of MOSFETs M3 and M4 so as to prevent current "shoot through" from $V_{in}$ to ground. FIG. 3 shows a boost converter 30 which includes an N-channel MOSFET M5 and a Schottky diode 32.

A common feature of the converters shown in FIGS. 1-3, as well as numerous other converter topologies, is that one or more power MOSFET switches are used to control the transfer of energy from an energy source, here represented by $V_{in}$, into at least two reactive energy storage elements, namely an inductor and a capacitor. These energy storage elements then retransfer the stored energy, when required, into the load. By monitoring $V_{out}$ and by either controlling the pulse width of the signal which controls the MOSFET switches (assuming that the converter is operating at a fixed frequency), or adjusting the switching frequency (while holding the on-time of the switches constant), a constant $V_{out}$ can be maintained, despite changes in $V_{in}$ or the current demands of the load.

Of the various switching mode converter topologies and control schemes, fixed frequency converters provide a predictable noise spectrum. A predictable noise spectrum is particularly advantageous in communication products, such as cellular phones, since shifting noise spectra can interfere with information transfer in the broadcast band. With a fixed clock period, the energy transfer is a function of the switch on-time (or pulse width), which is modulated to compensate for an energy drain or a voltage build-up at the output of the converter.

Most converters, in their essential configuration, include a PWM control circuit, an inductor, a capacitor, and two MOSFET switches (or one MOSFET switch and a Schottky diode). Ideally, every element transfers power without loss. In reality, of course, some power is lost in every element. The IC control circuit, for example, draws power to operate internal amplifier, voltage reference, comparator, and clock circuits. The inductor loses power to the resistance of its coil and to the material used as its magnetic core. Even the capacitor has a series resistance component which absorbs energy.

In practice, however, most of the power in a converter is lost in the power MOSFET that is used as the series switch and in the power MOSFET or Schottky diode that is used as the shunt switch or rectifier. These losses can be divided into four categories:

1. Conduction losses which arise from the MOSFETs' internal resistance, represented as $I^2 R \cdot D$, where I is the current through the switch, R is the on-resistance of the switch, and D is the percentage of the time that the switch is on.

2. Gate drive losses, or the power lost charging and discharging the MOSFETs' gate capacitance, represented as $Q_g \cdot V_{gs} \cdot f$, where $Q_g$ is the charge which accumulates on the gate, $V_{gs}$ is the gate-to-source voltage, and f is the frequency at which the switch is opened and closed.

3. Output capacitive losses, or the power lost charging and discharging the drain capacitance of the MOSFET switch, represented as $C_o \cdot V_{ds}^2 \cdot f$.

4. Crossover losses, or losses which occur during the switching transitions of the MOSFETs, as a result of the simultaneous presence of a current through and a voltage across a MOSFET, represented as $I_{on} \cdot V_{ds} \cdot \delta t$, where $I_{on}$ is the current through the MOSFET during the switching transition and $\delta t$ is the duration of the switching transition.

The conduction losses are strongly dependent on the current and on-resistance while the gate drive and output capacitive losses are strongly dependent on the switching frequency. At low frequencies, particularly below 100 kHz, only the conduction losses need to be considered when calculating the efficiency of the converter. At higher frequencies, particularly frequencies approaching 1 MHz, the capacitive losses become significant. $V_{in}$ and $V_{out}$ affect all of the energy loss terms. In high voltage converters the output capacitance term can be dominant. In low voltage applications such as computers and battery powered circuits, however, particularly those in which $V_{in}$ is less than 8 volts, the output capacitance term is negligible. The two dominant terms are then the gate drive and conduction losses, and the power loss can be approximated by the following equation.

$$P_{loss} = Q_g(V_{gs}) \cdot V_{gs} \cdot f + I^2 \cdot R_{ds}(V_{gs}) \cdot (t_{on}(V_{in})/T)$$

An increase in the gate drive $V_{gs}$ reduces $R_{ds}$ and conduction losses but increases gate drive capacitance losses. The frequency f and the load current I are weighting factors which determine which term is dominant. At higher frequencies, the gate drive capacitance loss becomes significant for all light load conditions.

FIGS. 4A-4J are graphs which illustrate how the efficiency and other parameters of a P-channel DMOS switch used in a synchronous buck converter (corresponding to P-channel MOSFET M1 in FIG. 1) vary as a function of the channel size or resistance of the P-channel DMOS switch.

Referring to FIG. 4A, the x-axis represents the die size of the P-channel buck switch normalized such that unity equals the size of a standard S0-8 package (approximately 90 mils×190 mils). Curve P1 shows the percentage of the total losses due to the gate capacitance $C_g$, curve P2 shows the percentage of the losses due to the switching of the MOSFET, and curve P3 shows the percentage of losses due to the on-resistance of the P-channel ($R_{ds}$(on)). Curve P4 shows the efficiency of the P-channel switch. The input (battery) voltage $V_b$ was 3.5 V, the output voltage $V_o$ was 2.7 V. the load current I was 0.3 A, and the buck converter was operated at a frequency f of 1 MHz. As is apparent, at low die sizes, the resistance losses (curve P3) dominate, while at large die sizes the capacitance losses (curve P1) dominate. The efficiency of the buck converter (curve P4) reaches a maximum at a normalized die size of about 0.2, which is the optimum die size for this set of parameters.

FIG. 4B shows the same data as a function of the channel resistance of the of the P-channel switch (in Ω). Curve P5 represents the percentage of losses due to $C_g$, curve P6 represents the percentage of losses due to switching losses, curve P7 represents the percentage of losses due to $R_{ds}$ (on), and curve P8 represents the efficiency of the P-channel switch.

FIGS. 4A and 4B indicate that the efficiency of the switch reaches a maximum. If the die size is either too large or too small the efficiency will suffer. Another factor which affects efficiency is the input voltage $V_b$.

FIG. 4C shows the efficiency as a function of die size (normalized as in FIG. 4A) at three levels of $V_b$. Curve P9 represents $V_b$=3.0 V, curve P10 represents $V_b$ =3.5 V, and curve P11 represents $V_b$=4.2 V. FIG. 4D shows the same data as a function of channel resistance. $V_o$, I and f are at the same levels as in FIGS. 4A and 4B. FIGS. 4C and 4D indicate that different die sizes and channel resistances are optimal depending on the level of the battery voltage that is being fed into the converter. The range of $V_b$ shown in FIGS. 4C and 4D corresponds roughly to the variation that occurs normally in a lithium ion battery as it fluctuates between a charged and discharged condition. When the battery is discharged (low $V_b$), the buck switch must be turned on a larger percentage of the time in order to keep the output voltage; thus, because $R_{ds}$(on) is more important in determining efficiency, it is preferable to have a larger die. Conversely, when the battery is fully charged (high $V_b$), the gate capacitance $C_g$ becomes more significant, and it is therefore preferable to have a smaller die.

While the actual maximum efficiency also varies with the battery voltage as shown in FIG. 4C, this is not the major problem. The main problem is that optimal size of the die for the buck switch varies from about 0.18 for a fully charged battery to about 0.25 for a medium battery to about 0.32 for a discharged battery.

Another factor which affects the efficiency of the PMOS switch is the load current I. FIG. 4E shows efficiency as a function of normalized die size for load currents of 0.9 A (curve P15), 0.3 A (curve P16) and 0.1 A (curve P17). The range from 0.9 A to 0.1 A corresponds, for example, to the load current used in a cellular phone as it goes from the transmit mode to the receive mode. Again, the efficiency of the switch varies greatly, as would be expected from the $I^2 \cdot R_{ds}$ term in the above equation for $P_{loss}$. As $I^2$ becomes greater, the value of $R_{ds}$ becomes more significant as a weighting factor, and a larger die becomes advantageous. To appreciate the importance of the load current, note that at I=0.9 A the peak efficiency occurs at die size of about 0.5, while at I=0.1 A the peak efficiency occurs at a die size of about 0.1. In other words, the size of the die would have to vary by a factor of about five in order to obtain maximum efficiency at both high and low load currents. Looking at the matter another way, if a die size of 0.25 were selected to maximize the efficiency (95%) at I=0.3 A, the efficiency of the switch would fall to about 92% in the high current condition and to about 90% in the low current condition. This in itself might be acceptable, but recall that the efficiency of the switch also varies with the battery voltage. The two effects are additive. The combined effects could create unacceptably low levels of efficiency.

FIG. 4F shows the same data as FIG. 4E as a function of channel resistance.

FIGS. 4G and 4H show the same data as FIGS. 4E and 4F, respectively, except that the low current has been reduced from 0.1 A to 0.05 A and, in FIG. 4G, the horizontal axis has been limited to a normalized die size ranging from 0.05 to 0.4, which is the interval of interest. The peak efficiency at the low current occurs at a die size that is well under 0.1. At that die size, if the current suddenly went to 0.9 A the efficiency would drop all the way down to around 77%. Clearly, a die size of less than 0.1 is completely incompatible with the high current condition.

FIGS. 4I and 4J show the same data as FIGS. 4G and 4H, respectively, plotted on semilog paper.

The main point is that all of these figures show significant variations in the optimum die size for different levels of current. At light current conditions, one way to improve efficiency is to reduce the gate drive losses (the $Q_g V_{gs} f$ term in the above equation). Once $V_{gs}$ (which is the same as the battery voltage $V_b$) has been set, the amount of charge $Q_g$ is determined by the die size. That leaves the frequency f is the only remaining variable, and in fact one way to solve the problem is to switch to a lower frequency at light load conditions. For example, if the converter is normally operating at 1 Mhz, the frequency could be reduced by an order of magnitude to 100 kHz, or even two orders of magnitude to 10 kHz. As a result the $Q_g V_{gs} f$ term becomes insignificant and only conduction losses are present at light load conditions. The problem with this solution is that switching the frequency takes a finite amount of time. For example, if the current suddenly increases and the efficiency falls to 65% or 70%, it takes some time to increase the frequency back up to the normal level. During the time interval while the converter is trying to speed up to the high frequency, the output voltage sags. Conversely, when the converter attempts to reduce the frequency, the output voltage may overshoot. In either case, voltage regulation is momentarily lost. Moreover, frequency shifting produces a range of harmonics which cannot readily be filtered out. This can present serious problems, particularly for converters that are used in communications equipment.

There is therefore a need for a MOSFET and a DC-DC converter design which provide low gate capacitive losses during light load conditions while providing low conduction losses during normal load conditions, without relying on frequency shifting or burst mode techniques.

SUMMARY OF THE INVENTION

The MOSFET of this invention includes a single source terminal, a single drain terminal and multiple gates, each of the gates being electrically isolated from the other gate or gates and having a gate width that is different from the other gate or gates. The preferred embodiment has dual gates, the larger of which has a gate width which is a multiple N times the gate width of the smaller gate. The factor N may commonly range from 5 to 500.

The MOSFET is preferably incorporated as a switch in a switching mode DC-DC converter. During the full power or normal running mode, a PWM signal is delivered to both gates, switching the MOSFET on and off. In this situation, the conduction losses of the converter are regulated by the total gate width of the MOSFET, which includes both gates, the larger gate carrying the major share of the current. When a light load condition is encountered, the larger gate is grounded, i.e. shorted to the source, and the PWM signal is supplied only to the smaller gate. Therefore, during a light load condition energy is not lost driving the capacitance of the larger gate.

In the preferred embodiment the output from a PWM controller is split into two paths leading to the large and small gates, respectively. The path leading to the large gate is ANDed with an enable signal. If the enable signal is brought high, both the large and the small gates are driven simultaneously by the PWM controller. If the enable signal is pulled low, the PWM signal to the large gate is cut off, and only the small gate is active.

The large gate can be activated or deactivated within a single cycle of the PWM signal, making the response time of the MOSFET essentially instantaneous. This is in sharp contrast to the inherent delays in systems which rely on frequency shifting to control the power losses.

The larger and smaller gates may be constructed in numerous ways. In a MOSFET containing a plurality of identical cells, a smaller number of cells may be allocated to the smaller gate, thereby reducing the total gate "width", i.e., the combined perimeters of the cells. A larger number of cells are allocated to the large gate. Alternatively, the gate width may be varied by changing the cell density in certain areas of the device, with a lower cell density being used to reduce the total gate width of the small gate.

The preferred embodiments are constructed in the form of vertical current flow MOSFETs which share common source and drain terminals. However, the multiple gate structure is applicable to MOSFETs that are vertical, lateral or quasi-lateral, with or without field oxide steps in the drain, trench gated or nontrench gated, P-channel or N-channel, double diffused or conventional, and formed in an epitaxial layer or in a diffused well.

BRIEF DESCRIPTION OF THE DRAWING

FIGS. 10A–10D are equivalent circuit diagrams describing the operation of a DC-DC converter according to the invention with only the small gate operative.

DESCRIPTION OF THE INVENTION

The preferred embodiment of this invention is a dual-gated power MOSFET in which the two gates are electrically isolated from each other and have substantially different gate widths. The MOSFET has a single drain and a single source.

Figure 5:
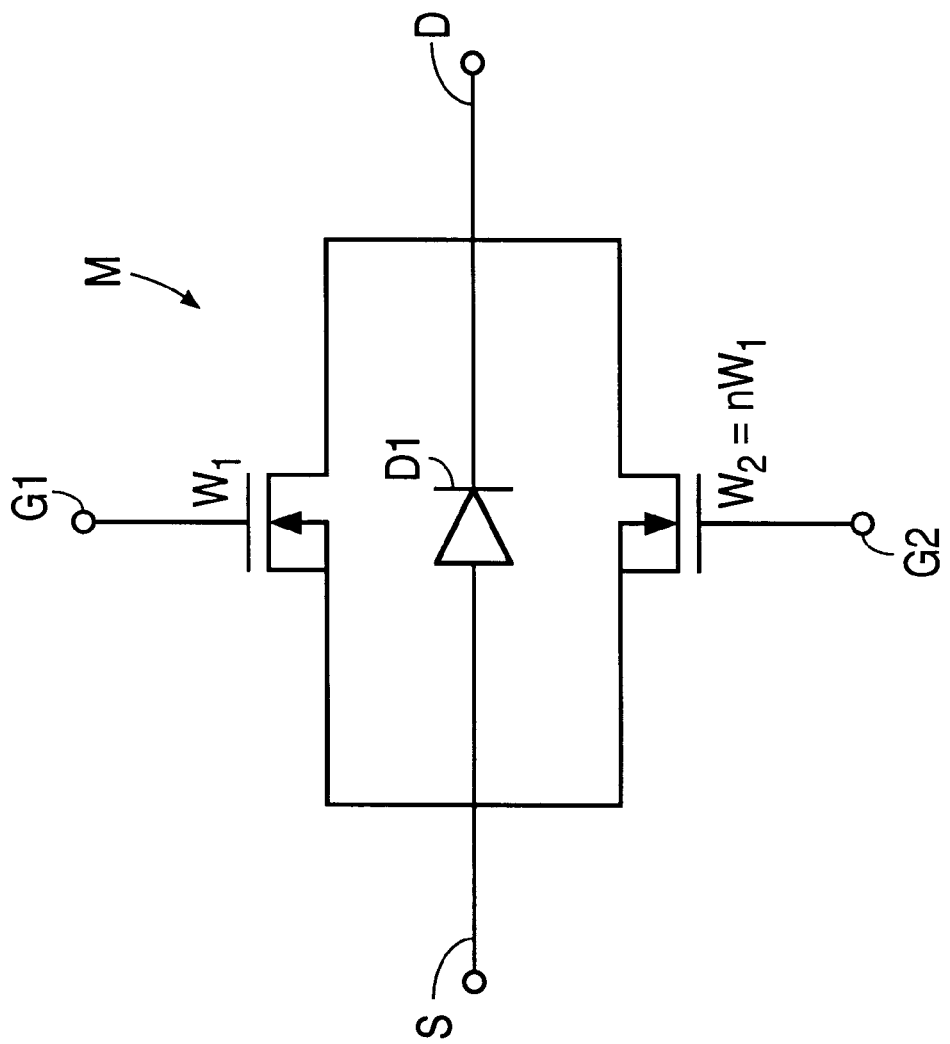
FIG. 5 is a schematic diagram of a dual-gated N-channel MOSFET in accordance with this invention.

A schematic diagram of such a MOSFET is shown in FIG. 5. N-channel MOSFET M includes a source S and a drain D, the source S being shorted to the body of the MOSFET to prevent the parasitic NPN bipolar transistor from turning on. A diode Di represents the "antiparallell" diode formed by the PN junction between the drain D and the body of MOSFET M. The state of MOSFET M is controlled by gates G1 and G2, which have widths equal to W1 and W2, respectively. W2 is equal to the factor N times W1.

Figure 6B:
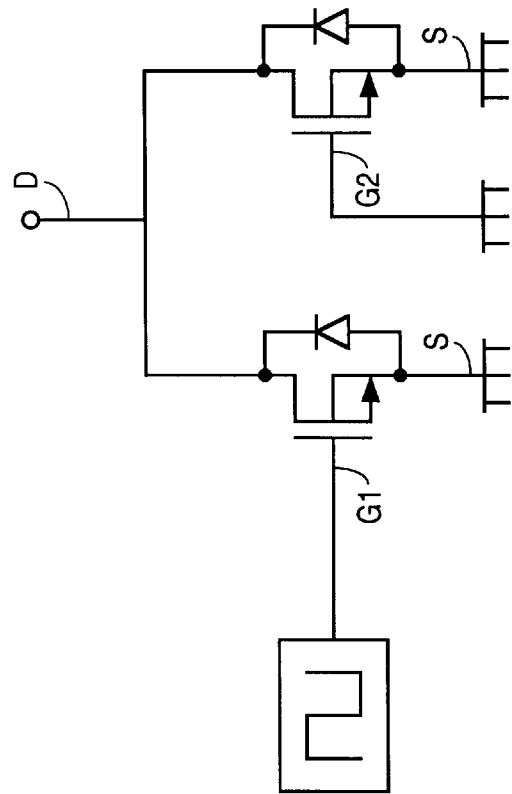
FIGS. 6A and 6B illustrate schematically the operation of the MOSFET of FIG. 5 in full power and light load conditions, respectively.
Figure 6A:
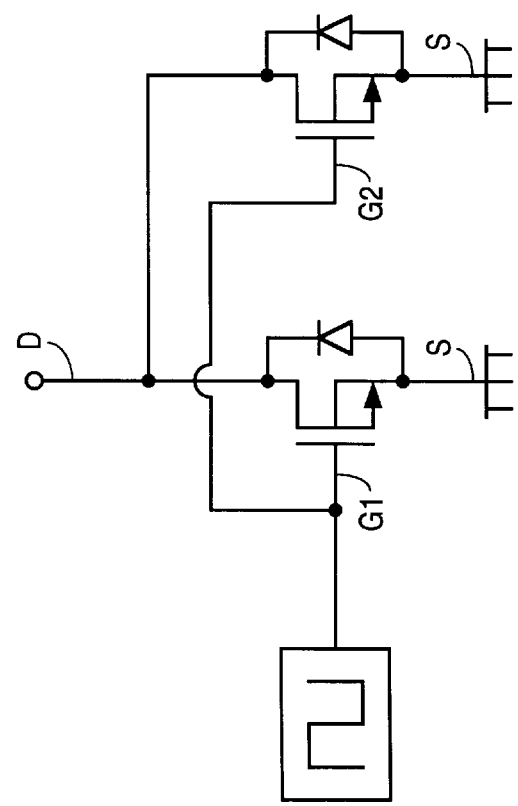

FIGS. 6A and 6B illustrate schematically the operation of MOSFET M in full power and light load conditions, respectively. As shown in FIG. 6A, during the full power or normal running mode, both of gates G1 and G2 are switched on and off by a pulse width modulation (PWM) signal. If the multiplier factor N is large, the channel controlled by the gate G2 will carry the major share of the current, and the on-resistance of MOSFET M will be relatively low. While gate G1 could be turned off in the full power mode, it is normally convenient to continue switching it as well.

As shown in FIG. 6B, when a light load condition is encountered, the PWM signal continues to switch gate G1 while gate G2 is grounded. Thus, during a light load condition, energy is not lost unnecessarily by driving the capacitance of the larger gate G2.

Figure 7:
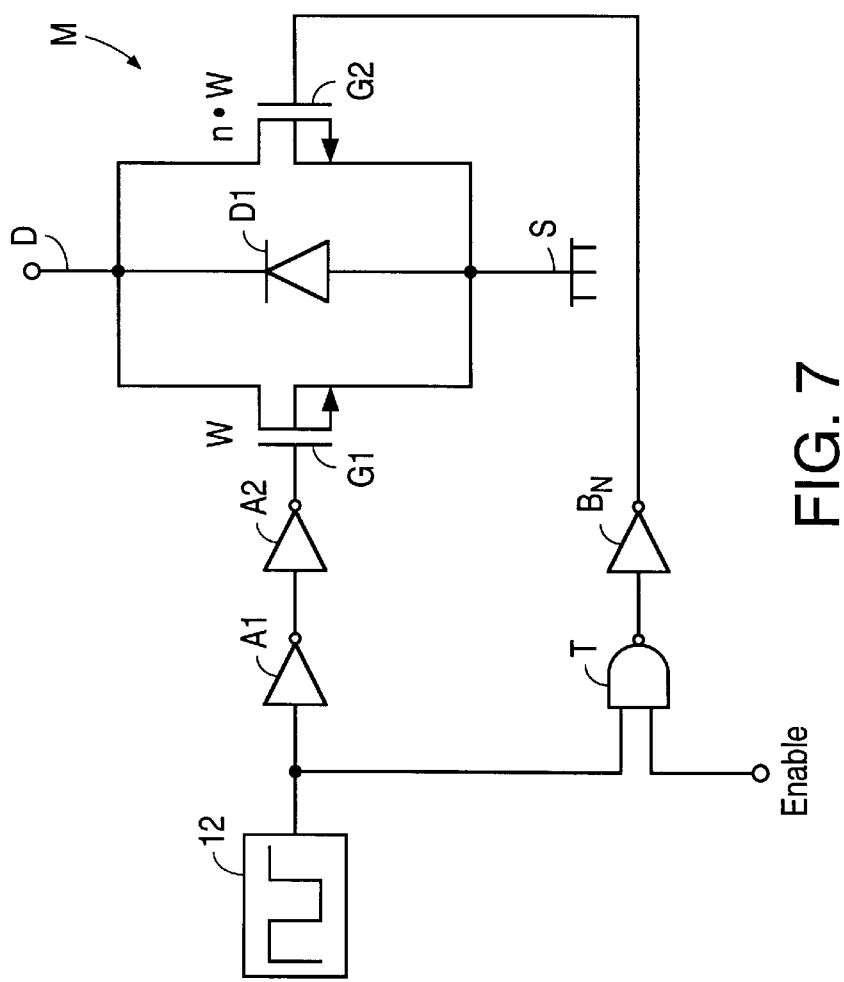
FIG. 7 is a circuit diagram of an arrangement for controlling the gates of the MOSFET shown in FIG. 5.
Figure 8:
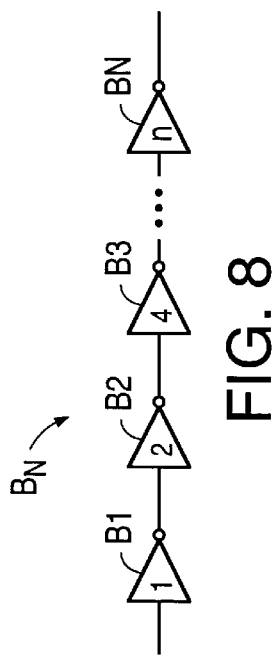
FIG. 8 is a circuit diagram of the inverter chain shown in FIG. 7.

An arrangement for controlling the gates G1 and G2 is shown in FIG. 7. The signal from PWM control 12 is split into two paths. The PWM signal to the smaller gate G1 passes through inverters A1 and A2, which are sized to handle the drive requirements of gate G1 at the frequency of PWM control 12 (e.g., 1 MHz). If necessary, inverter A2 can be stepped up in size as compared to inverter A1 so as to provide an appropriate current to gate G1. The signal path to gate G2 contains a similar but larger inverter chain $B_N$ which contains N inverters (see FIG. 8) to deliver a larger current to gate G2. The path to gate G2 also passes through a NAND gate T1, the other input to NAND gate T1 being connected to a source of an enable signal. If the enable signal is brought high, gate G2 will be switched in unison with gate G1. If the enable signal is pulled low, gate G2 immediately stops switching. Thus gate G2 can be enabled or disabled instantaneously, and MOSFET M therefore responds without delay to a change from a full power to a light load condition, or vice versa.

Figure 9:
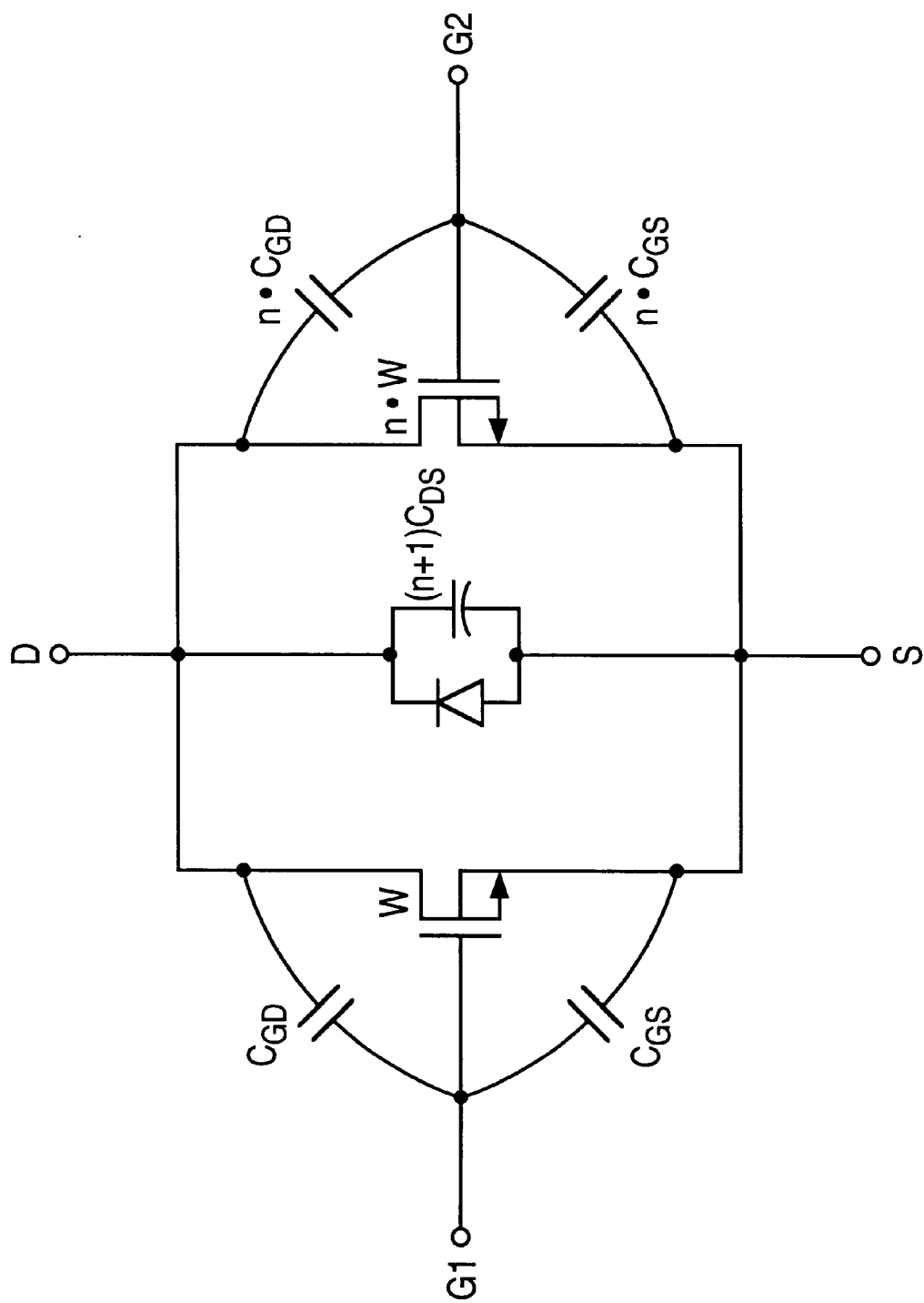
FIG. 9 illustrates schematically the capacitances present in the MOSFET of FIG. 5.

FIG. 9 illustrates schematically the capacitances present in MOSFET M. On the input side, there are capacitances $C_{GD}$ and $C_{GS}$ between gate G1 and drain D and between gate G1 and source S, respectively, and capacitances equal to N times $C_{GD}$ and N times $C_{GS}$ between gate G2 and drain D and gate G2 and source S, respectively. The total drain-to-source capacitance of MOSFET M is shown as (N+1) times $C_{DS}$, the drain-to-source capacitance associated with gate G1. It can be shown that the effective input capacitance and the drain current $I_D$ both are scaled down by a factor of 1/(N+1) when gate G2 is disable during a light load condition, while the output capacitance remains the same.

Figure 10D:
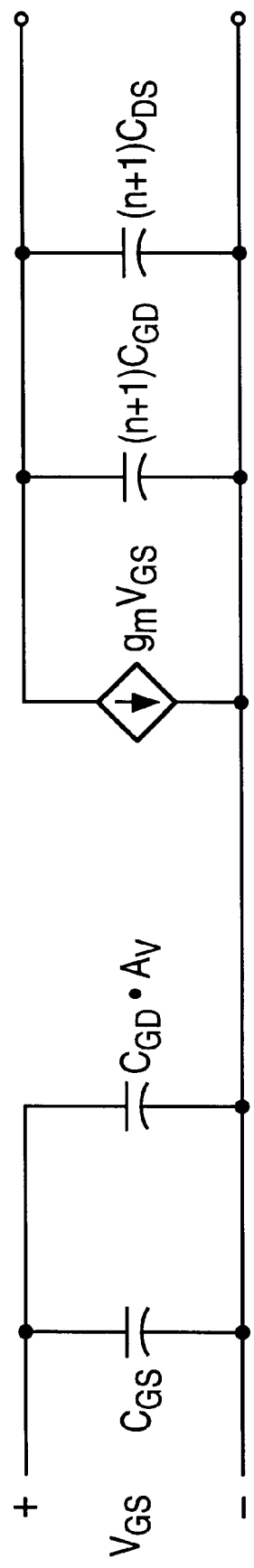

The sequence of FIGS. 10A–10D shows the equivalent circuit of the converter of FIG. 9 when only the smaller gate G1 is being switched. FIG. 10A shows the basic structure, with each side of the MOSFET having a gate-to-source, gate-to-drain and drain-to-source capacitance, as well as a transconductance multiplied by the corresponding gate-to-source voltage. Accordingly, the side associated with gate G1 has a capacitances $C_{GS}$, $C_{GD}$ and $C_{DS}$ with an output current $g_m V_{GS1}$, while the side associated with gate G2 has capacitances $nC_{GS}$, $nC_{GD}$ and $nC_{DS}$ with an output current $ng_m V_{GS2}$. Note that the drain-to-source capacitances $C_{DS}$ and $nC_{DS}$ are in parallel and are therefore additive. When the gate G2 is grounded, as shown in FIG. 6B, the circuit shown in FIG. 10B emerges. FIG. 10B also shows that the drain-to-source capacitance of the two sides have been combined with the sum equal to (n+1) $C_{DS}$. In this mode the device has an input capacitance $C_{GS}$ between the gate G1 and the source. It also has a feedback capacitance $C_{GD}$ between the gate G1 and the drain. The gain term $ng_m V_{GS2}$ equals zero and therefore appears as an open source. Another capacitance $nC_{GD}$ appears between the drain and the source (since gate G2 is connected to the source (ground). The equivalent circuit also has an output transconductance $g_m$ (corresponding to the smaller gate) which is multiplied by the gate voltage $V_{GS1}$; and the output capacitance of the entire device is equal to $(n+1)C_{DS}$. FIG. 10C shows an equivalent circuit with the feedback capacitance removed by reflecting it into the input circuit and into the output circuit. The method of reflection is well known in circuit (network) analysis and involves splitting a feedback component into an equivalent input and output subcircuit with no feedback. The two decoupled half-circuits are therefore more amenable to circuit analysis. Assume that gate G1 is driven with a small signal input $\Delta V_{GS1}$. The change in the output current is then given by $g_m \Delta V_{GS1}/\Delta t$. The current in the feedback capacitor is therefore roughly $\Delta V_{DS} C_{GD}/\Delta t \approx I_{CGD}$, where $\Delta V_{DS}/\Delta t = g_m(V_{GS}/\Delta t)(r_o \| R_L) C_{GD}$. Thus $I_{CGD} = g_m(\Delta V_{GS}/\Delta t)(r_o \| R_L) C_{GD}$. The current on the gate side of the capacitor is given by $I_{CGD} = C_{in}(eq)(\Delta V_{GS}/\Delta t)$. Accordingly, $C_{in}(eq) = g_m (r_o \| R_L) C_{GD}$. However, where $g_m(r_o \| R_L) = A_v$ (the voltage gain), then $C_{in}(eq) = A_v C_{GD}$ for the feedback capacitor in the input circuit.

When the feedback capacitance is reflected into the output circuit, the capacitance $C_{GD}$ is multiplied by $A_v/(1+A_v)$ which is approximately equal to unity for high-gain devices. Hence, $C_{GD}$ is not amplified relative to the output circuit. The result is that $C_{GD}$ is in parallel with $nC_{GD}$, or $(n+1)C_{GD}$, as shown in FIG. 10D. However, when the feedback capacitance is reflected into the input circuit, it is increased by a gain of 5 or 6 as a result of the Miller effect. This gain is actually a weighted average of all operating bias conditions during the switching transient.

Figure 11:
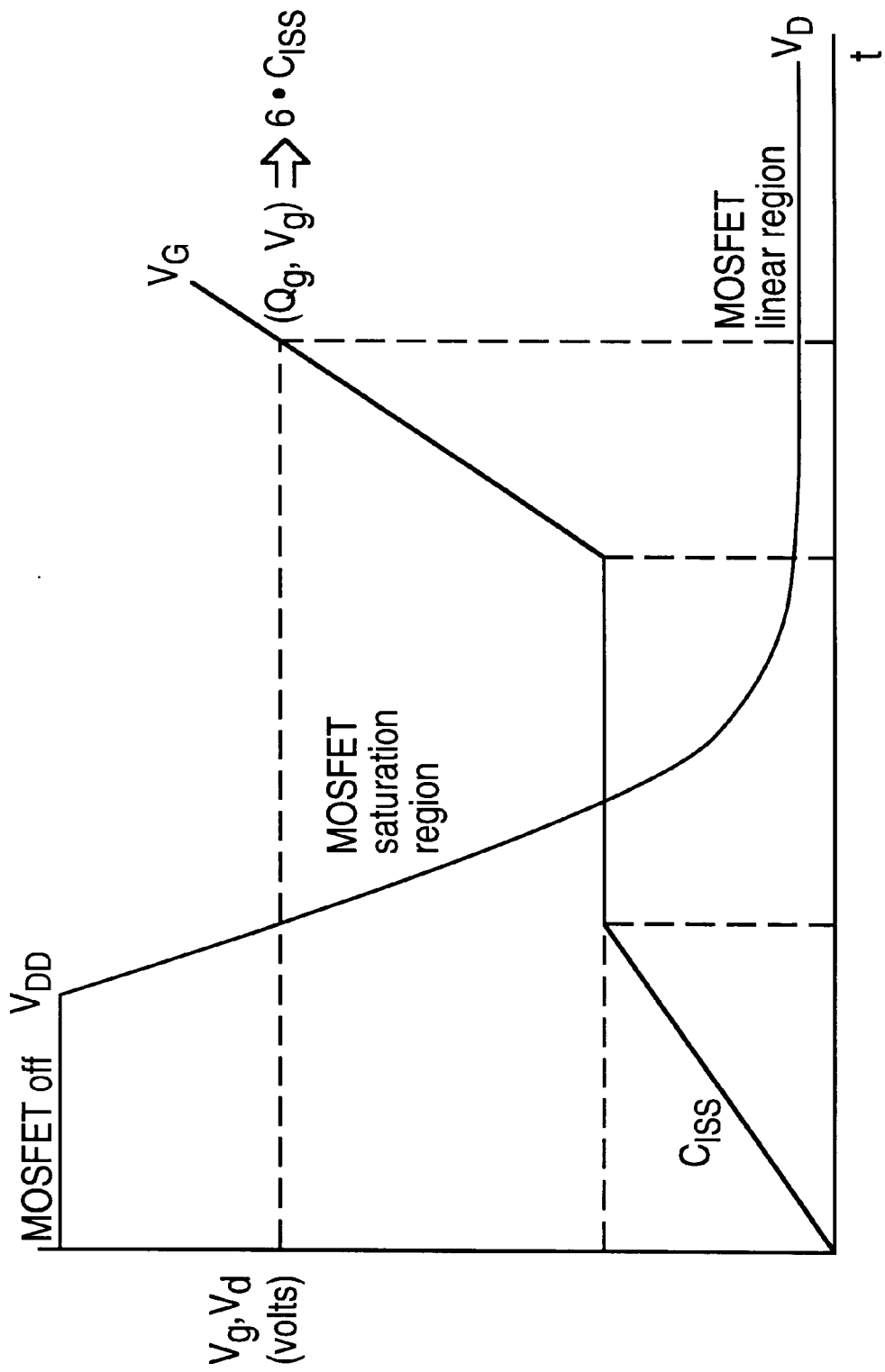
FIG. 11 is a graph showing the gate and drain voltages of a MOSFET as a function of time as the MOSFET is turned on by supplying a constant current to the gate.

The reason for this is shown in FIG. 11, which is a graph showing the behavior of the gate voltage $V_G$ and the drain voltage $V_D$ under the influence of a constant current $I_G$ flowing into the gate. The horizontal axis is time, with t=0 at the time that the gate current begins to flow. Initially, $V_G$ is at zero and $V_D$ is at $V_{DD}$. As the current flows into the gate, $V_G$ rises linearly at a rate determined by the small signal gate capacitance $C_{ISS}$. This continues until the threshold voltage is reached and the device begins to turn on, at which point $V_D$ begins to fall. As $V_D$ falls, the feedback capacitor $C_{GD}$ is charging and in so doing draws charge which would otherwise go into the gate capacitor. If the gate drive has limited current, it must satisfy the displacement current requirements of the feedback capacitor and therefore $V_G$ reaches a plateau and does not increase further until $V_D$ stops falling (the device is turned fully on). If a voltage source is used to drive the gate the plateau may be small, but the extra charge is still supplied. The net result is that the amount of charge that flows into the gate when the device is fully turned on corresponds to an equivalent gate capacitance which is roughly 6 times the small signal gate capacitance $C_{ISS}$.

Thus, in FIG. 10D the capacitance in the input side is shown as $C_{GS}$ in parallel with $C_{GD} A_V$, where $A_V$ is the voltage gain of the MOSFET while it is in the saturation region. The voltage gain $A_V$ varies with gate bias and is approximately equal to $g_m (R_L \| r_o)$, where $g_m$ is the transconductance, $R_L$ is the resistance of the load that is being driven by the converter, and $r_o$ is the small signal output impedance of the saturated MOSFET. The voltage gain and hence the small signal input capacitance change continuously as the gate bias changes during a transient.

Figure 12A:
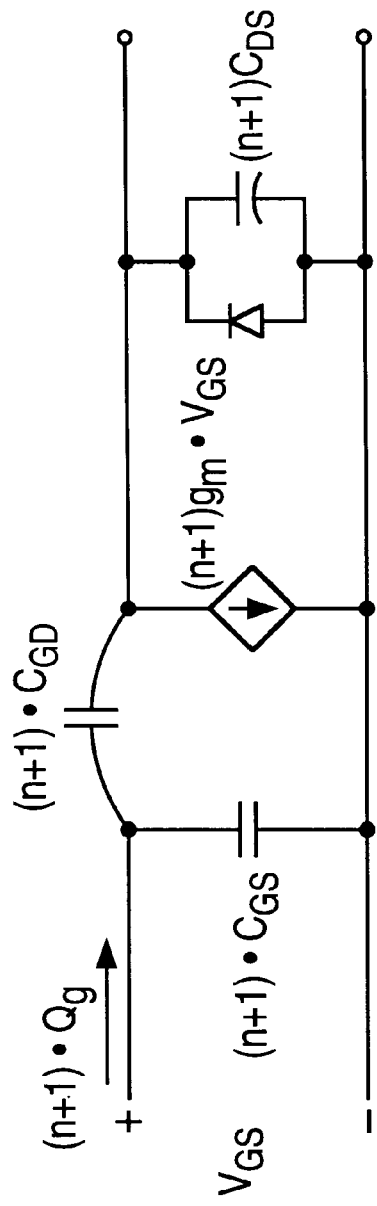
FIGS. 12A and 12B are equivalent circuit diagrams of a DC-DC converter according to the invention with both the small and large gates operative.
Figure 12B:
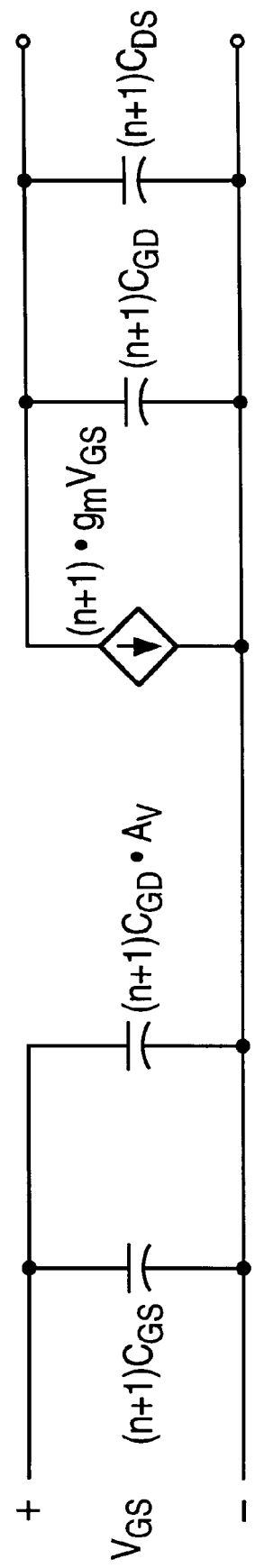

FIGS. 12A and 12B show the corresponding equivalent circuits when both gates G1 and G2 are operative. Since gate G2 is no longer grounded, the feedback capacitance is equal to $(n+1)C_{GD}$. The output capacitance is the same as shown in FIGS. 10A and 10B, but the input capacitance (which again is increased as a result of the Miller effect) is greater than the input capacitance shown in FIGS. 10A and 10B by a factor of $(n+1)$.

In other words, switching from both gates G1 and G2 to gate G1 alone is not equivalent to switching to a smaller MOSFET, since certain nodes and capacitances remain in the circuit at all times. Further information concerning the operation of MOSFETs in DC-DC converters may be found in Williams et al., "High-Frequency DC/DC Converter for Lithium-Ion Battery Applications Utilizes Ultra-Fast CBiC/D Process Technology", IEEE Advan. Power Elec. Conf. (APEC), May 1995, Dallas, Tex., pp. 322–332, and Williams et al., "Optimization of Complementary Power DMOSFETs for Low-Voltage High-Frequency DC-DC Conversion", id., pp. 765–772, both of which are incorporated herein by reference in their entirety.

Figures 13A, 13B:
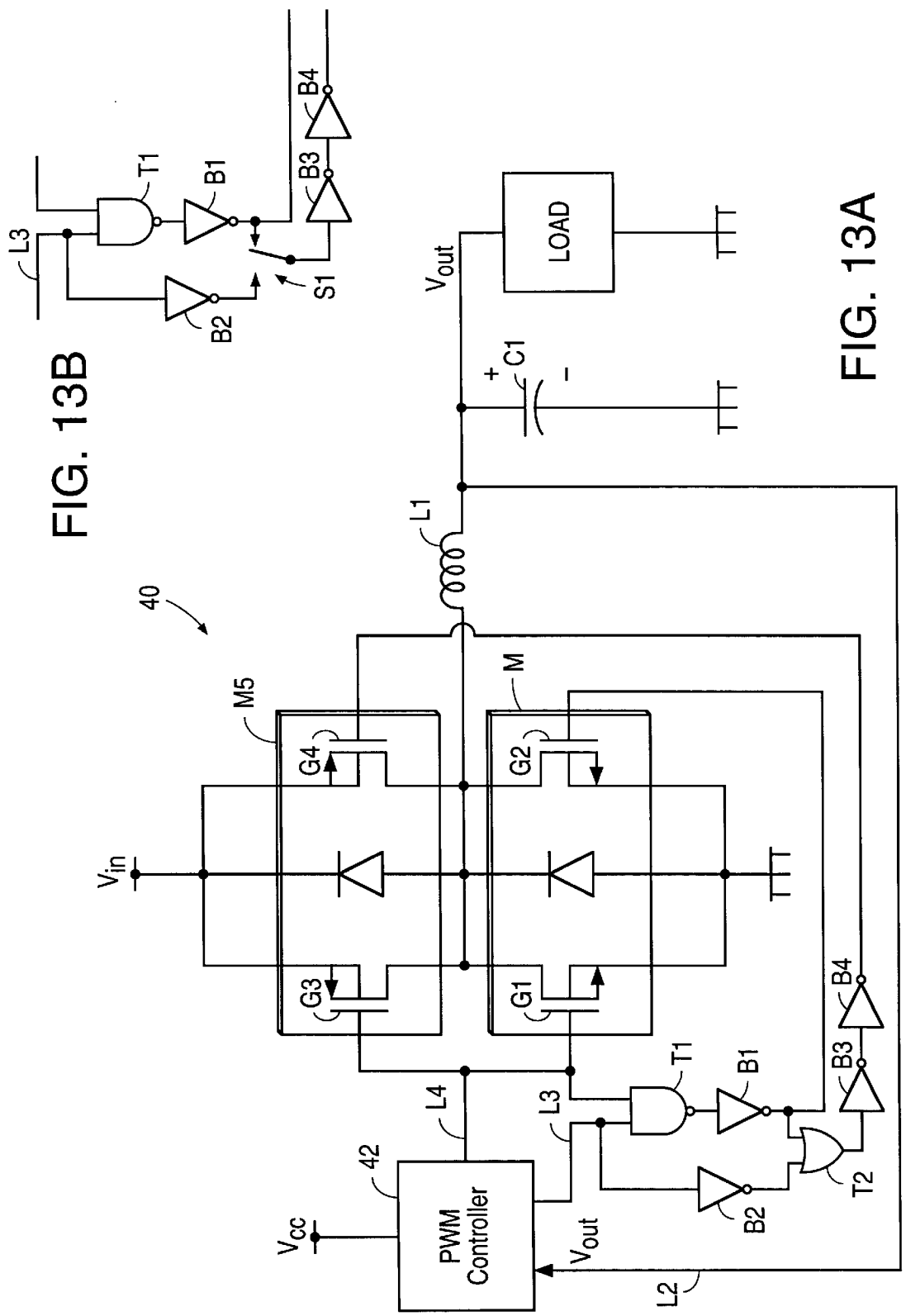
FIG. 13A is a circuit diagram of a complementary synchronous buck converter in which an N-channel dual-gated MOSFET is used as a synchronous rectifier or shunt switch and a dual-gated P-channel MOSFET is used as a series switch.
FIG. 13B is a circuit diagram which shows an equivalent circuit for the logic shown in FIG. 13A.

FIG. 13A is a circuit diagram of a complementary synchronous buck converter 40 which includes the dual-gated MOSFET M as an N-channel synchronous rectifier or shunt switch. A similar dual-gated P-channel MOSFET M5 is used as a series switch. MOSFET M5 includes a small gate G3 and a large gate G4. Gates G1 and G3 are supplied in parallel by a PWM controller 42 over a line L4. The PWM signal from controller 42 is directed through a NAND gate T1 and an inverter B1 to gate G2. The drive for gate G4 is fed through an inverter B2 and is ORed with the output of inverter B1 in an OR gate T2. The output of OR gate T2 is buffered by inverters B3 and B4.

The output of converter 40 is fed back to controller 42 through a feedback line L2. Controller 42 senses a full load condition in the load and delivers a high signal (1) on a line L3, which is connected to an input of NAND gate T1. The gate drive on line L4 is thus passed to gates G2 and G4. In a light load condition a low signal (0) appears on line L3. This produces a low signal at gate G2 and a high signal at gate G4, turning the corresponding channels off and reducing the input capacitance that must be driven by controller 42.

Table 1 is a truth table for the logic circuitry including NAND gate T1, OR gate T2 and inverters B1–B4.

TABLE 1

| Load Condition | Line L3 "enable" | Line L4 "clock" | Gate G2 (N-ch) | Gate G4 (P-ch) |
| --- | --- | --- | --- | --- |
| Full | 1 | 1 | 1 (on) | 1 (off) |
| Full | 1 | 0 | 0 (off) | 0 (on) |
| Light | 0 | 1 | 0 (off) | 1 (off) |
| Light | 0 | 0 | 0 (off) | 1 (off) |

As shown in FIG. 13B, OR gate T2 acts as the functional equivalent of a double-pole switch S1 which effectively connects gate G4 either to the output of inverter B1 (when line L3 is high driving the output of inverter B2 low) or to the output of inverter B2 (when line L3 is low driving the output of inverter B2 high). Since the output of inverter B1 mimics line L4 when the output of inverter B2 is low, gate G4 is effectively connected to line L4 in this condition.

In an alternative embodiment, gate G1 (and the associated source, channel and drain regions) is removed from the circuit and gate G2 functions as a conventional synchronous rectifier. In a light load condition gate G2 is turned off and any recirculation current from inductor L1 must pass through the diode that is in parallel (i.e., antiparallel) with the channel associated with gate G2. With this approach the efficiency of the device under extremely light loads is further improved since the diode's rectifying characteristic forces the converter into discontinuous conduction and prevents reversal of the inductor current and oscillations leading to higher losses.

Figure 14:
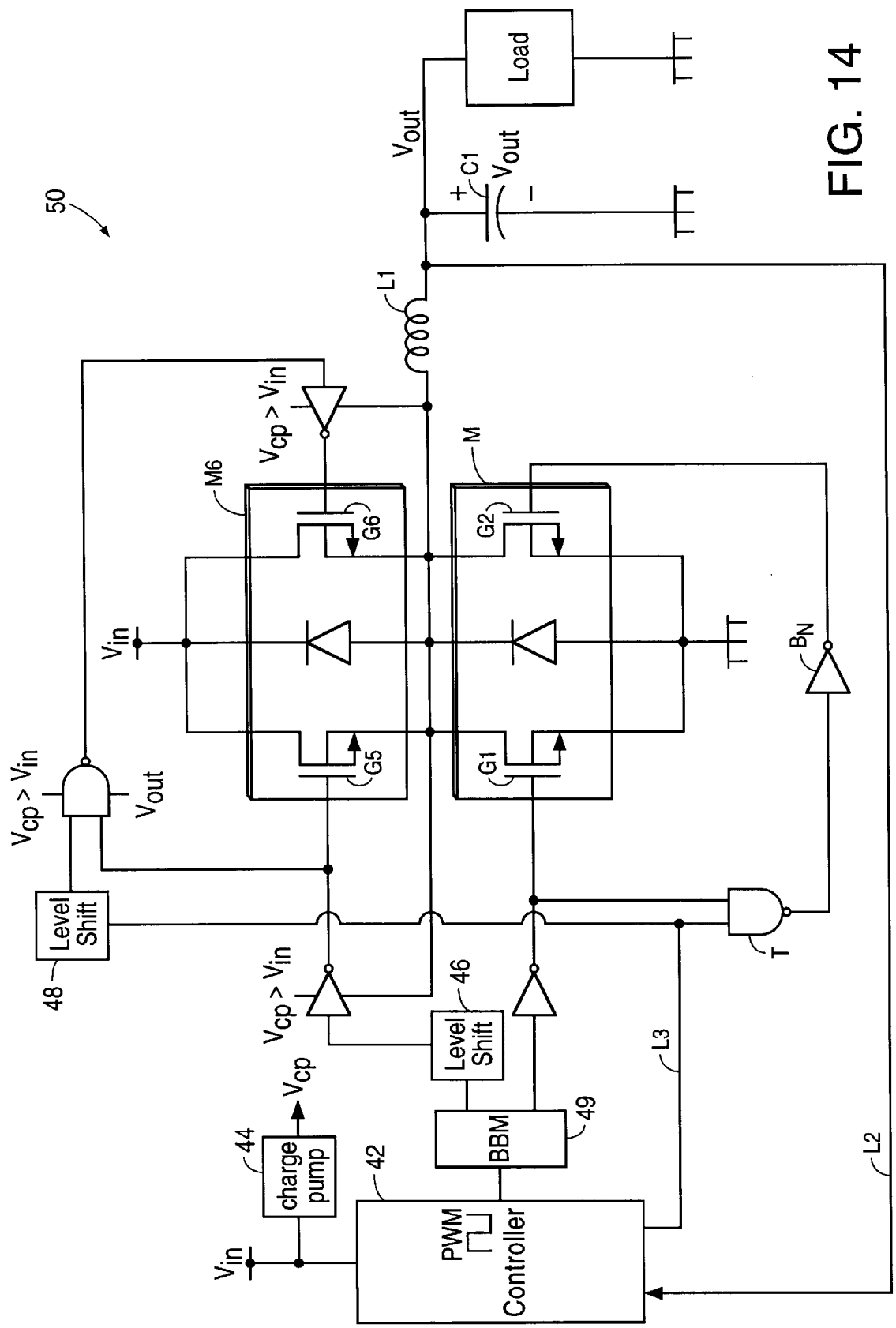
FIG. 14 is a circuit diagram of a buck converter in which an N-channel dual-gated MOSFET is used as a high side series switch.
Figure 15A:
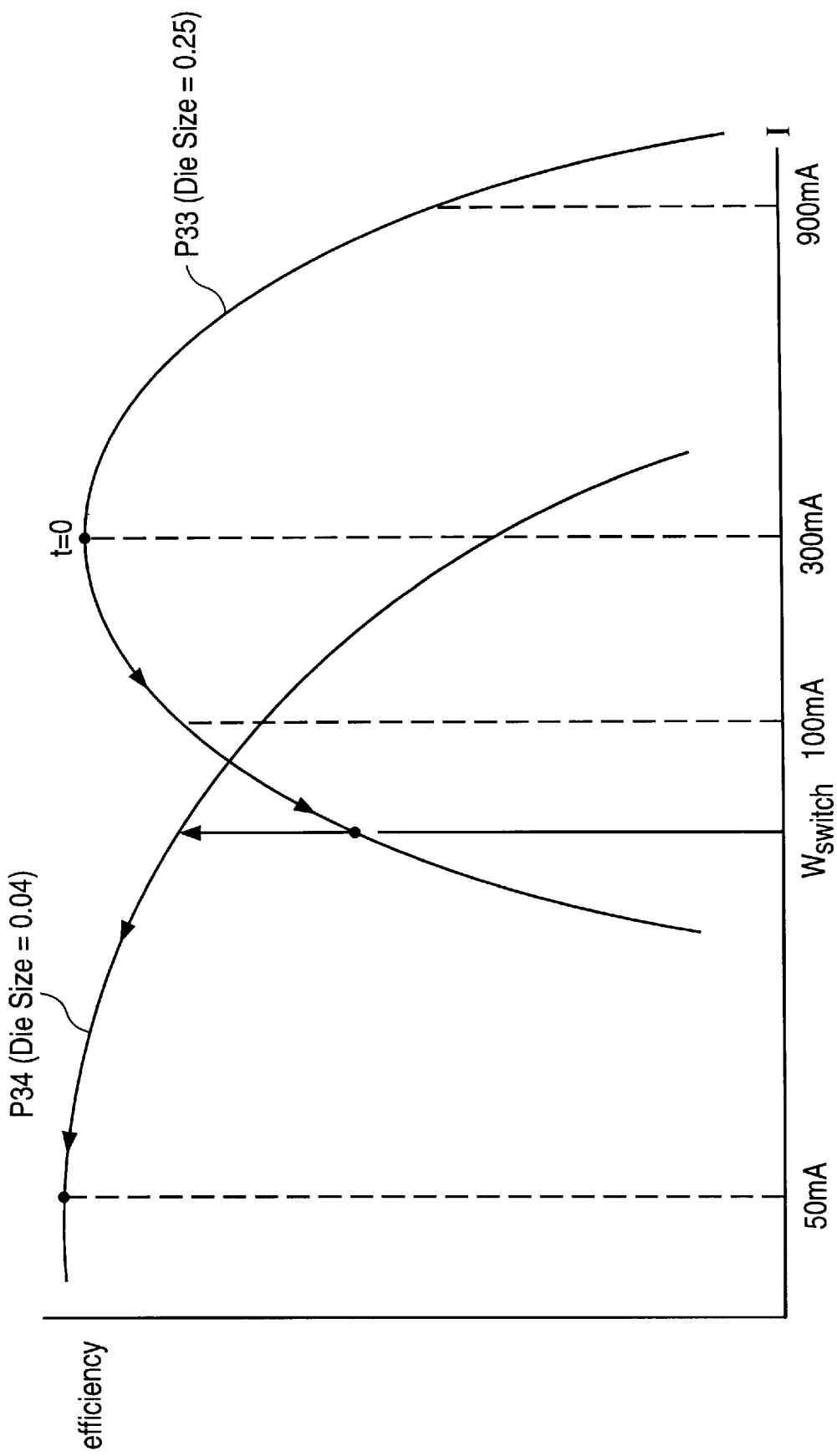
FIG. 15A is a graph showing the efficiency of a MOSFET switch in a DC-DC converter according to the invention as a function of load current as the load current falls from a normal to a light-load condition.
Figure 15B:
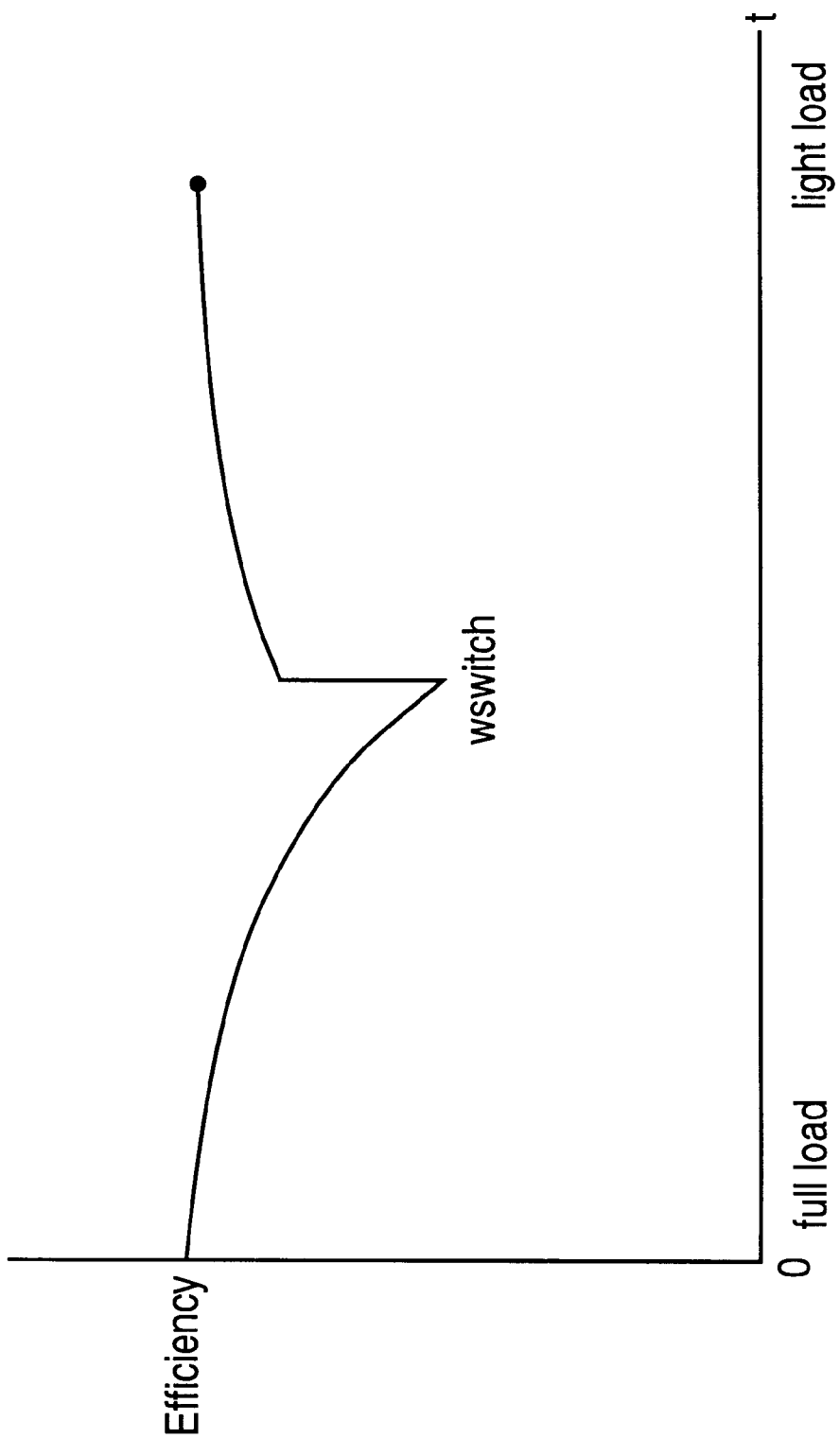
FIG. 15B is a graph showing the efficiency of the MOSFET switch as a function of time as the load current falls from the normal to light load conditions.

FIG. 14 is a circuit diagram of a buck converter 50 which is similar to buck converter 40 except that an N-channel dual-gated MOSFET M6 is used as the high side series switch. MOSFET M6 has a small gate G5, which is paired with gate G1, and a large gate G6, which is paired with gate G2. Since the gate drive of N-channel MOSFET M6 must exceed $V_{in}$, a charge pump 44 is used to supply a voltage $V_{cp}$. Level shifters 46 and 48 are used to insure that the voltages delivered to gates G5 and G6 are referenced to the output voltage $V_{out}$ rather than ground. A break-before-make unit 49 insures that the gates of MOSFETs M and M6 are not driven high simultaneously (i.e., MOSFET M6 is turned off before MOSFET M is turned on, and vice versa), so as to prevent a shoot-through current from $V_{in}$ to ground. The transition from a normal condition to a low current condition is illustrated in FIG. 15A. FIG. 15A is a graph of efficiency as a function of current for two die sizes (normalized as above), a die size of 0.25 in which the efficiency is maximized at a normal current of 0.3 A (curve P33) and a die size of 0.04 in which the efficiency is maximized at low current of 0.05 A (curve P34). At a time t=0 the converter is operating with both gates at a current of 0.3 A. The current begins to fall and the efficiency begins to drop slightly. When the controller senses that the current has reached a preset level (e.g., 0.09 A) the PWM signal is blocked from the large gate, and the efficiency begins to rise again until it reaches a maximum at 0.05 A. FIG. 15B shows the same process with the efficiency plotted as a function of time.

Figure 1:
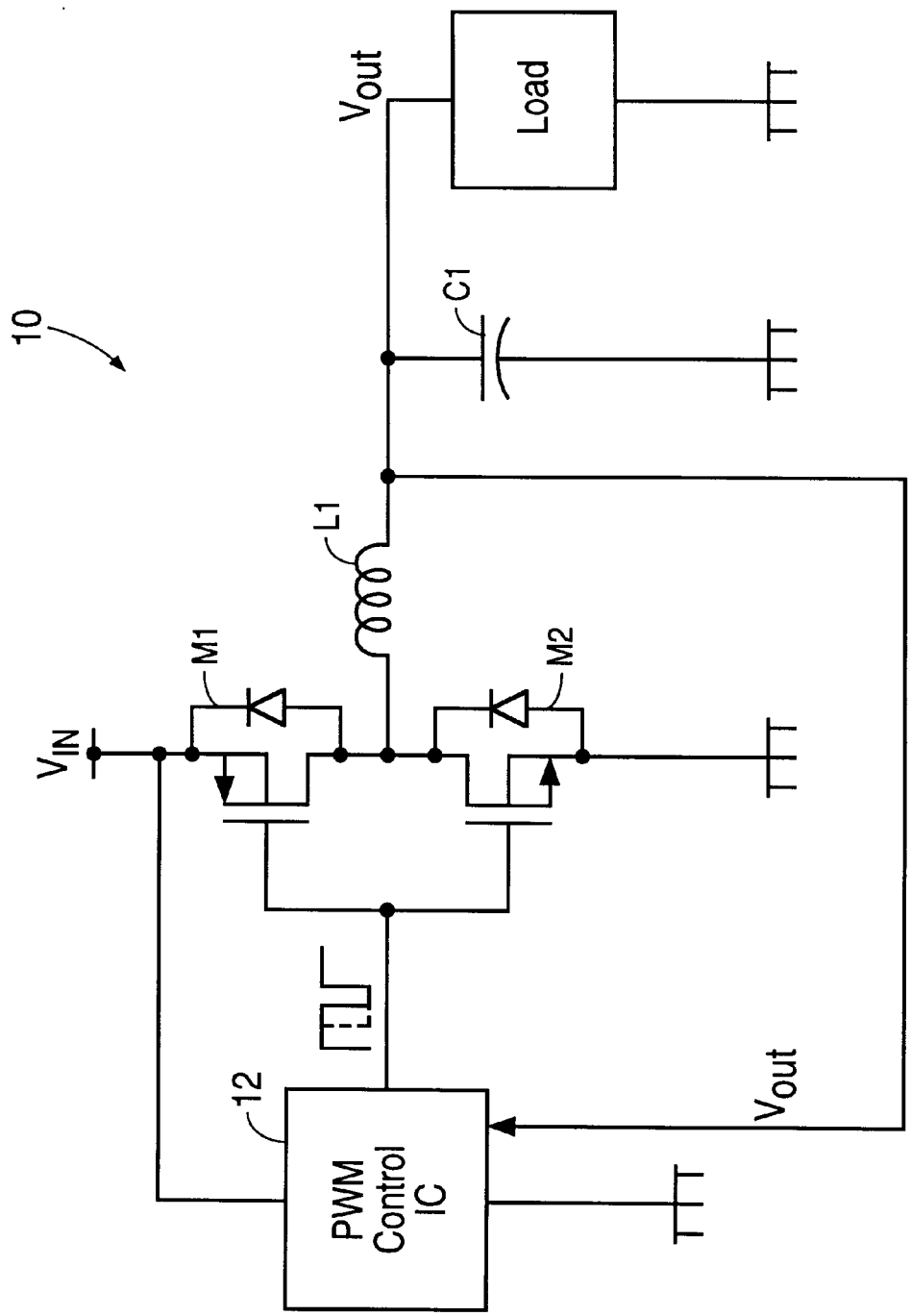
FIG. 1 is a circuit diagram of a conventional complementary synchronous buck converter.
Figure 2:
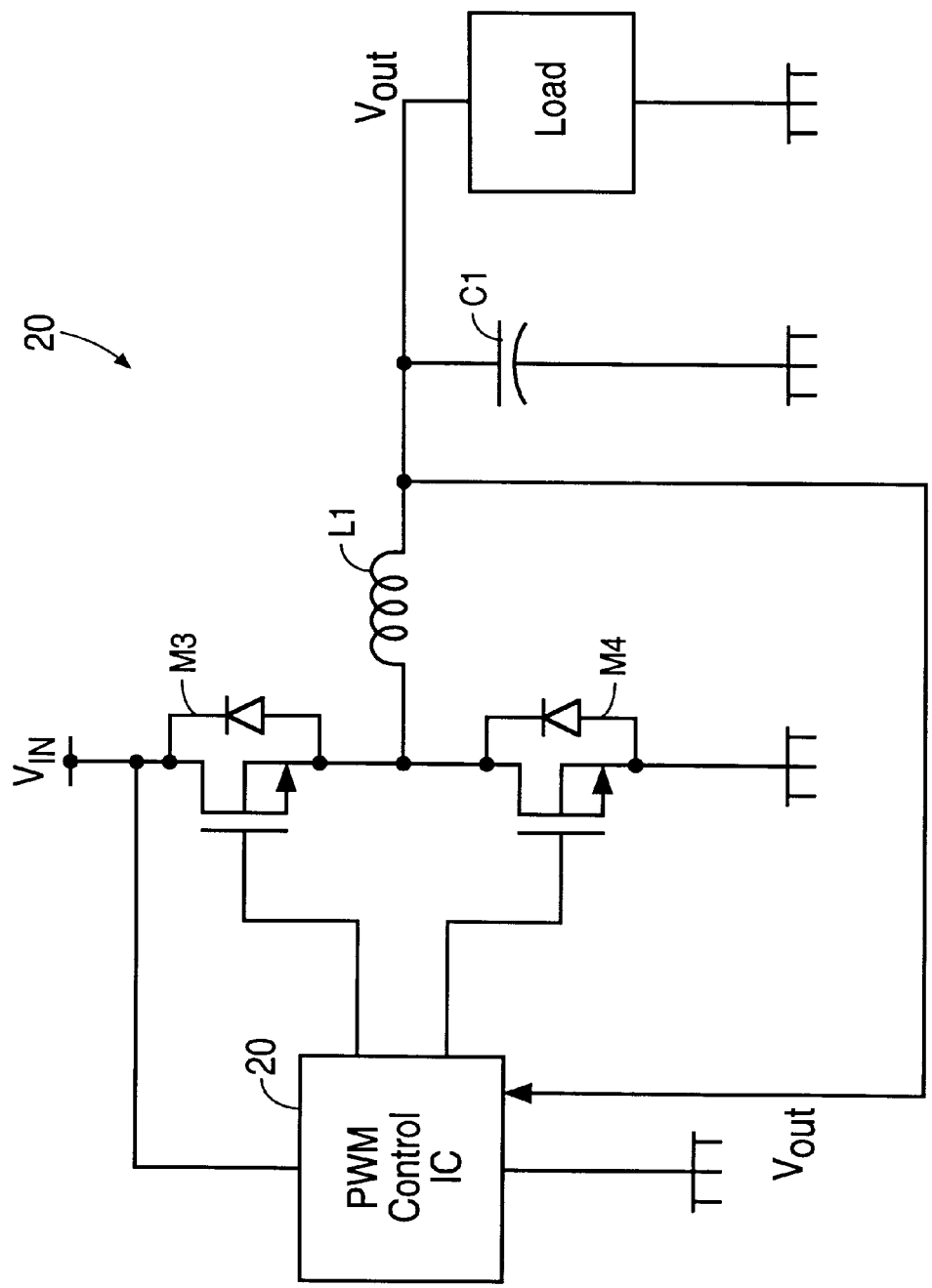
FIG. 2 is a circuit diagram of a conventional totem pole N-channel synchronous buck converter.
Figure 3:
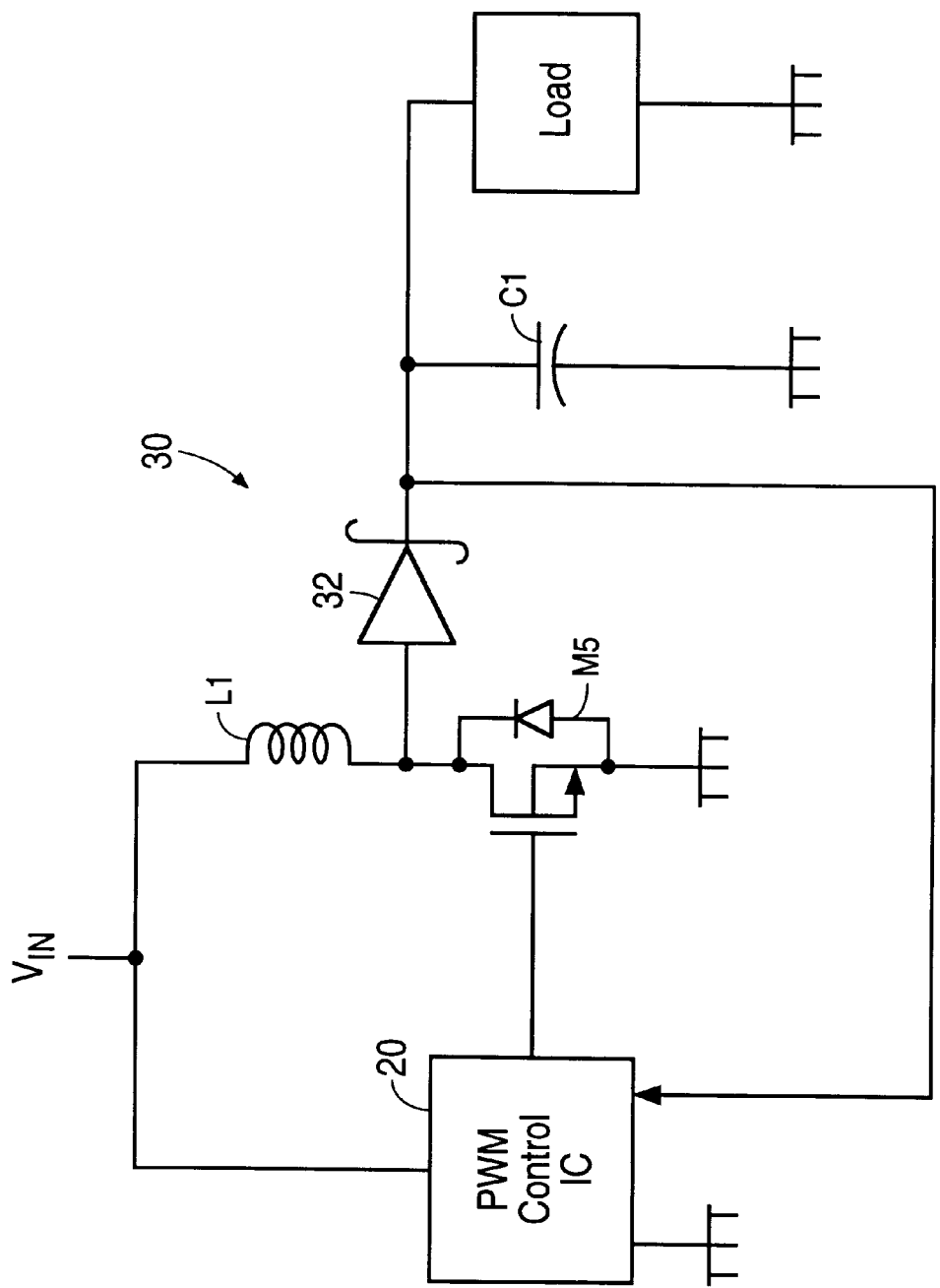
FIG. 3 is a circuit diagram of a conventional boost converter.
Figure 4A:
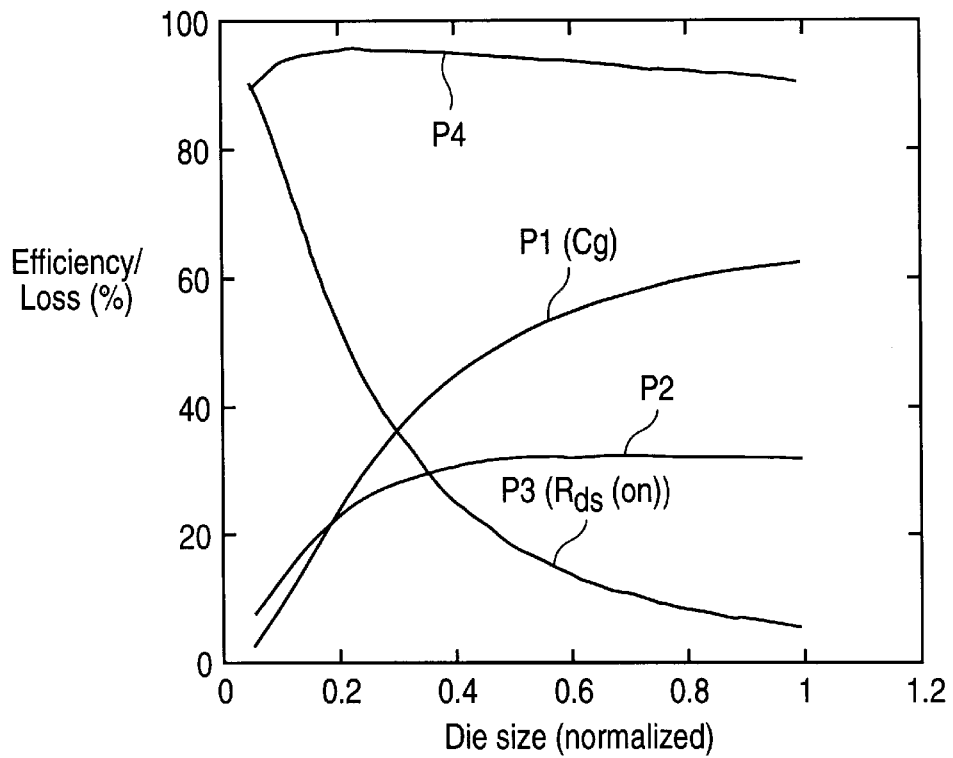
FIG. 4A is a graph which illustrates the percentage of the power loss in a synchronous buck converter that is attributable to the gate capacitance, the switching transitions, and the on-resistance of the buck switch, respectively, as well as the efficiency of the buck switch, plotted as a function of die size normalized to the size of an S0-8 die (approximately 90 mils×190 mils).
Figure 4B:
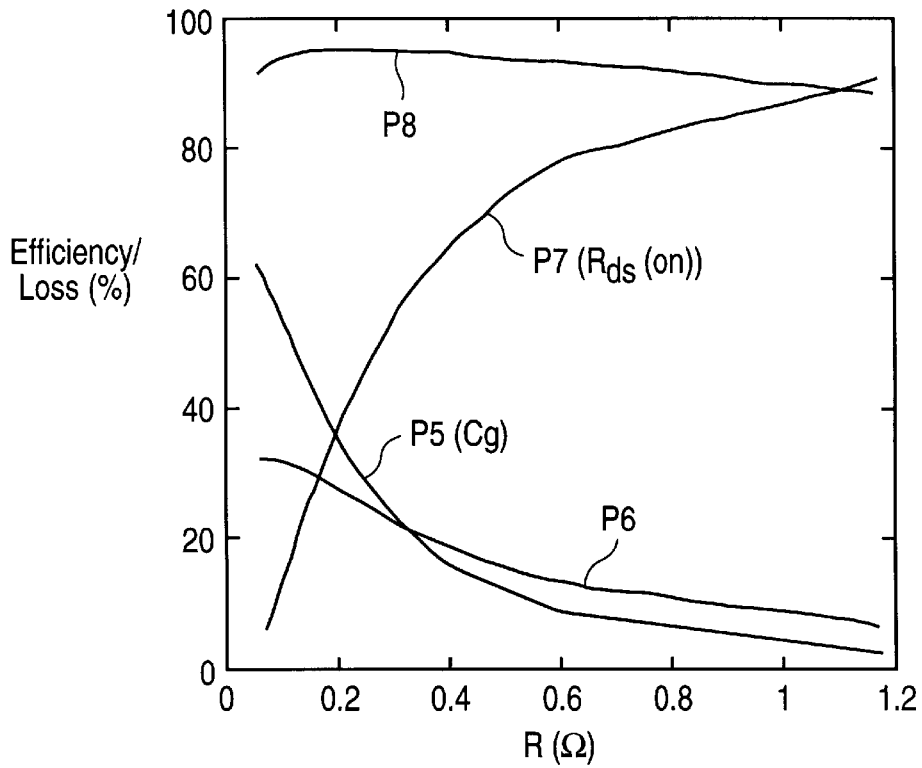
FIG. 4B is a graph showing the same data as FIG. 4A plotted as a function of the channel resistance of the buck switch.
Figure 4C:
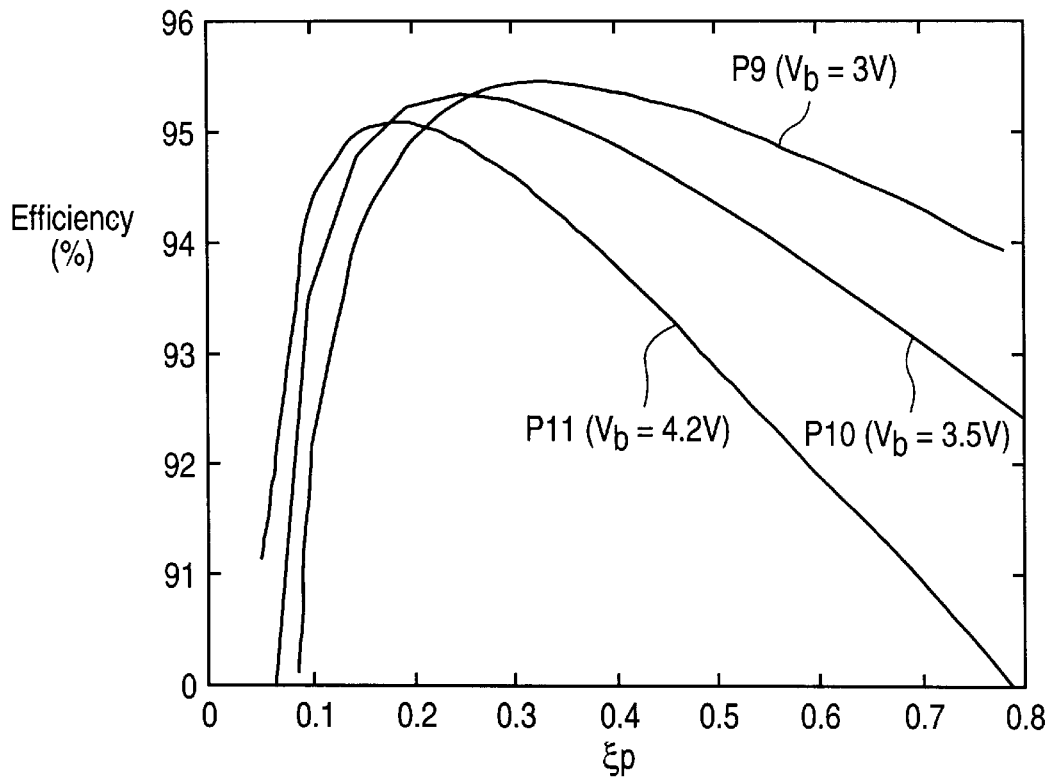
FIG. 4C is a graph showing the efficiency of the buck switch as a function of die size (normalized as in FIG. 4A) at three levels of input (battery) voltage (3.0 V, 3.5 V and 4.2 V).
Figure 4D:
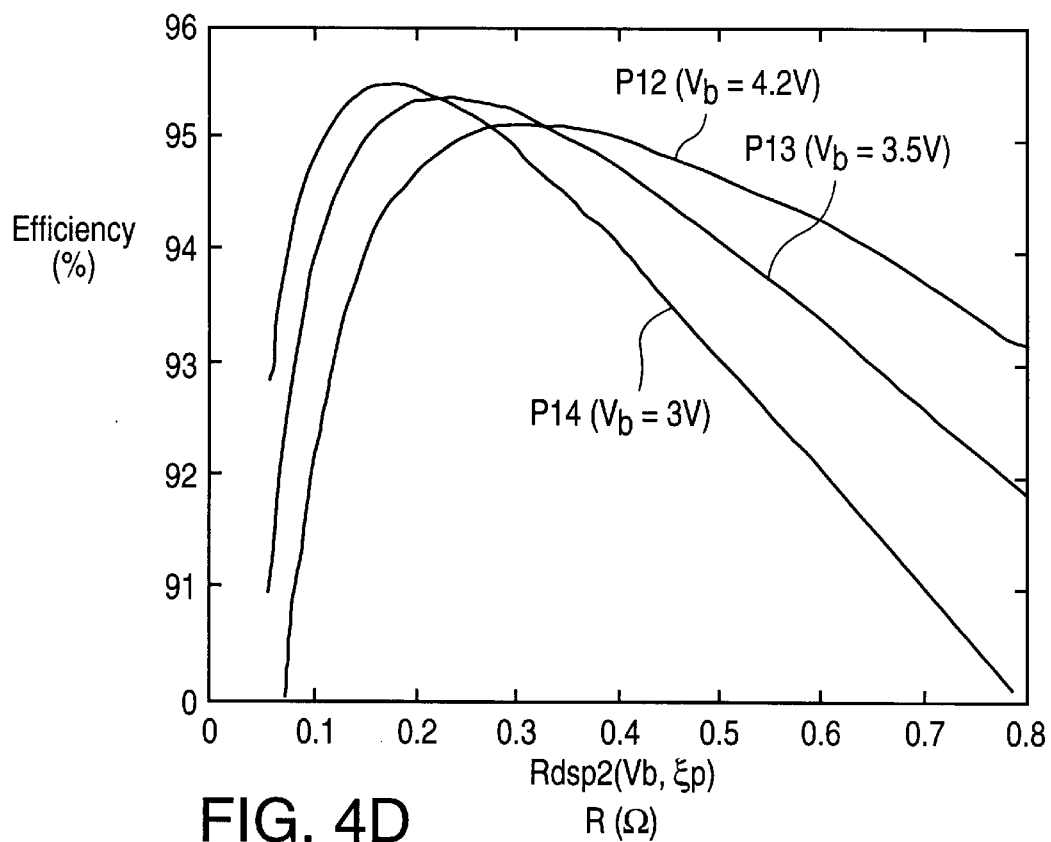
FIG. 4D is a graph showing the same data as FIG. 4C plotted as a function of the channel resistance of the buck switch.
Figure 4E:
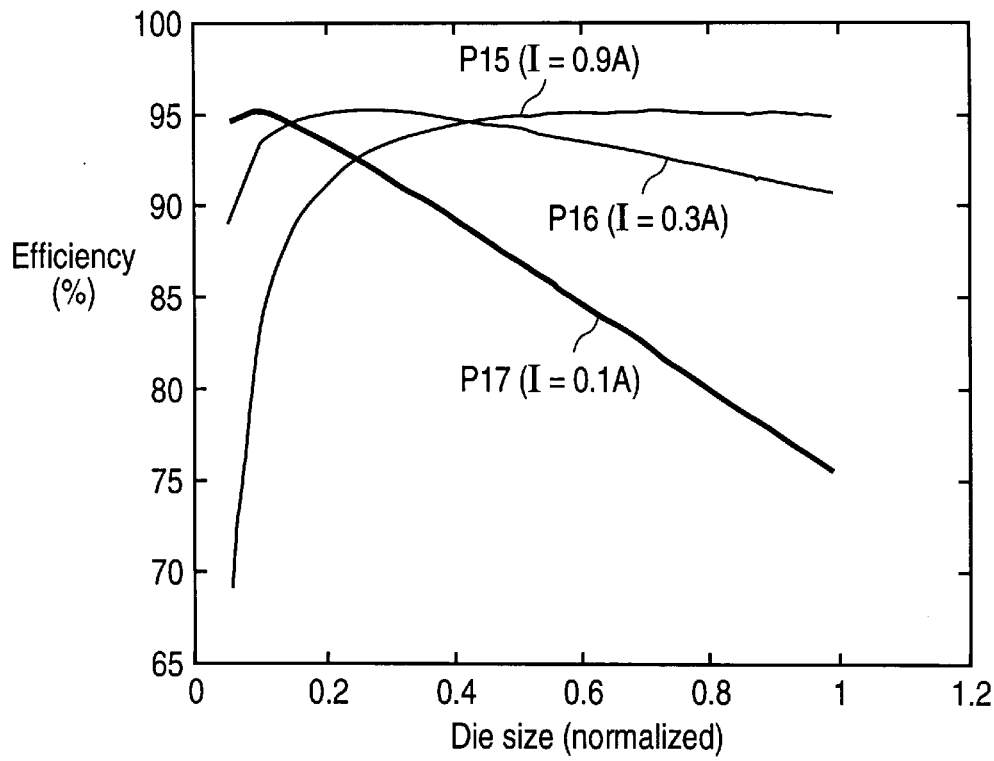
FIG. 4E is a graph showing the efficiency of the buck switch as a function of die size (normalized as in FIG. 4A) at three levels of load current (0.1 A, 0.3 A and 0.9 A).
Figure 4F:
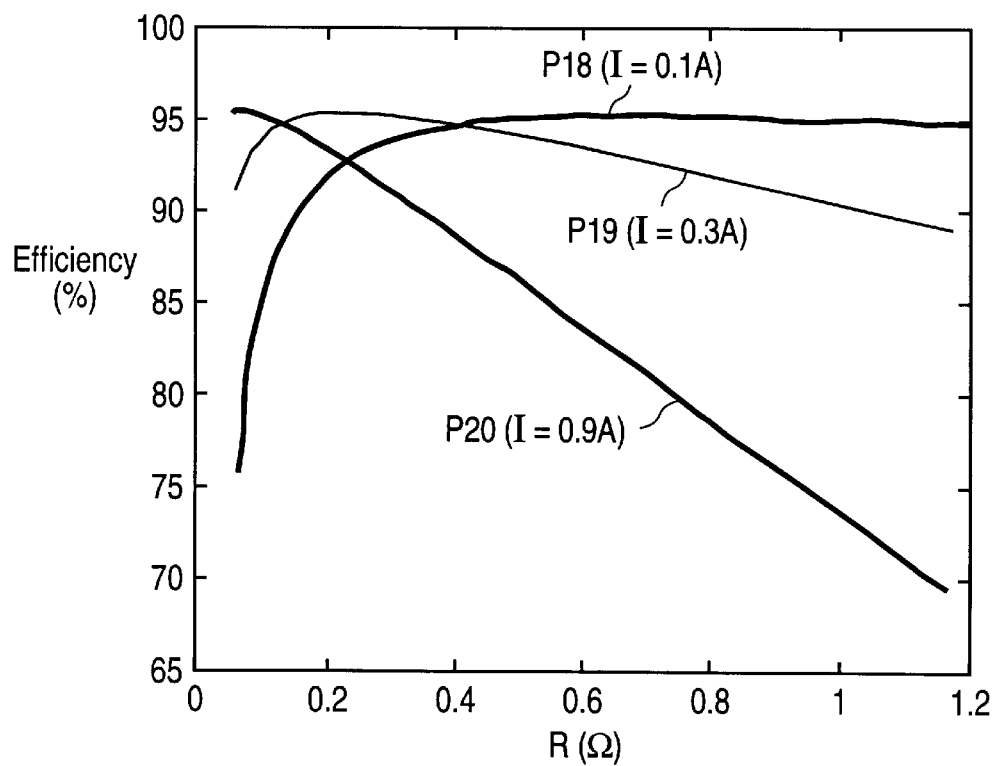
FIG. 4F is a graph showing the same data as FIG. 4E plotted as a function of the channel resistance of the buck switch.
Figure 4G:
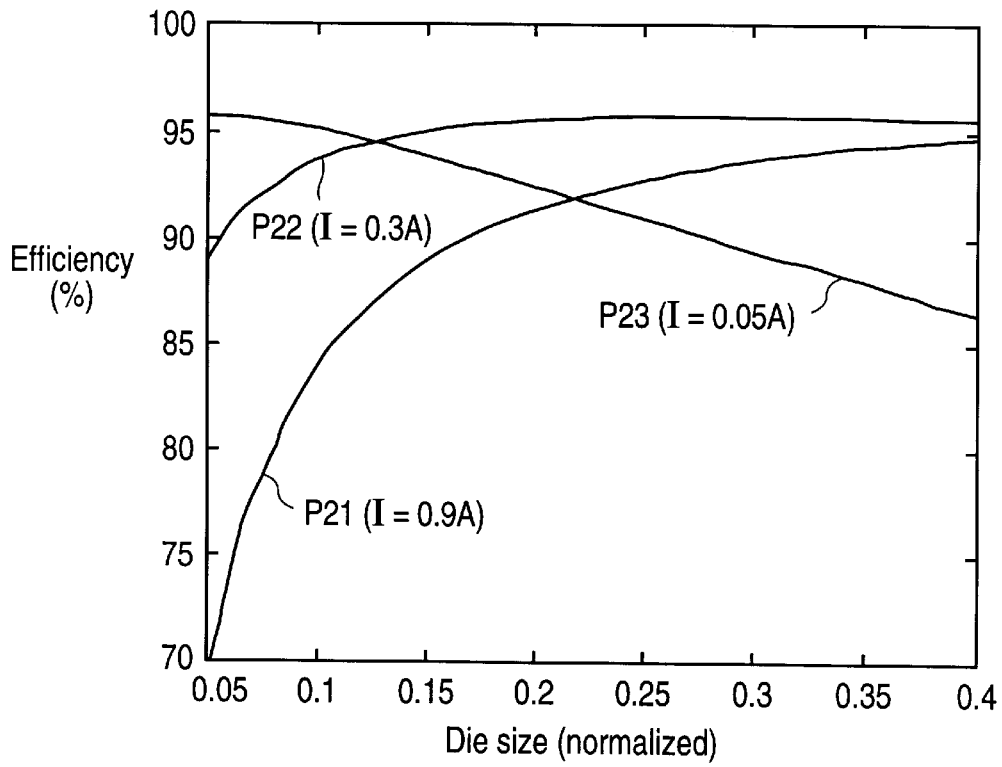
FIG. 4G is a graph showing the efficiency of the buck switch as a function of die size (normalized as in FIG. 4A) at three levels of load current (0.05 A, 0.3 A and 0.9 A).
Figure 4H:
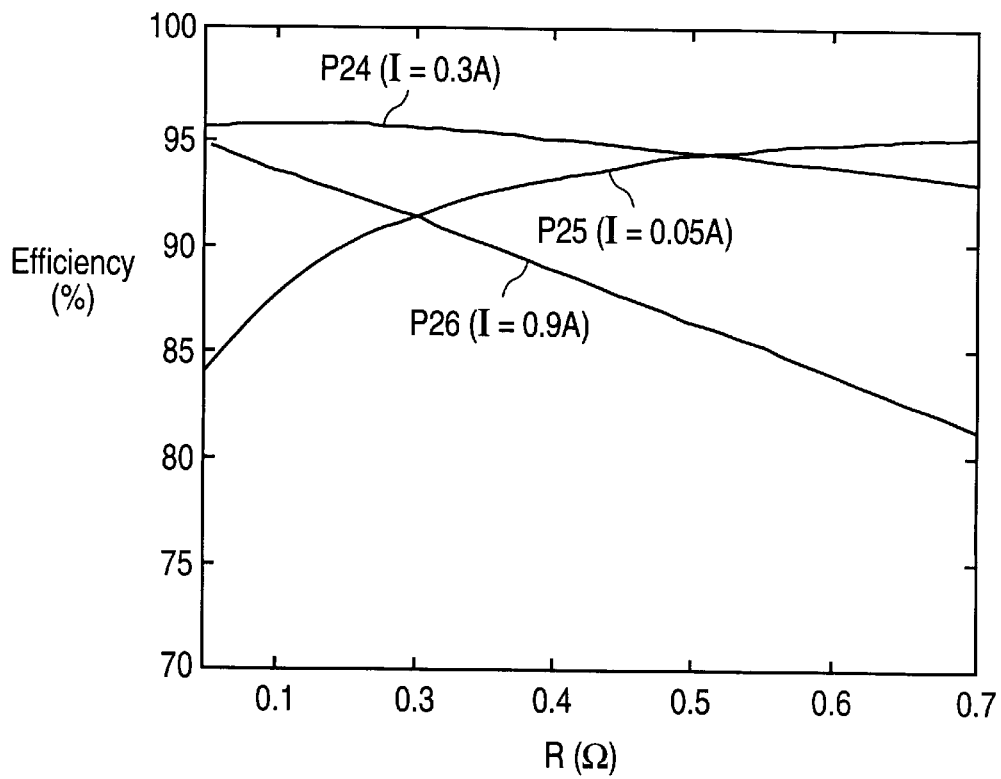
FIG. 4H is a graph showing the same data as FIG. 4G plotted as a function of the channel resistance of the buck switch.
Figure 4I:
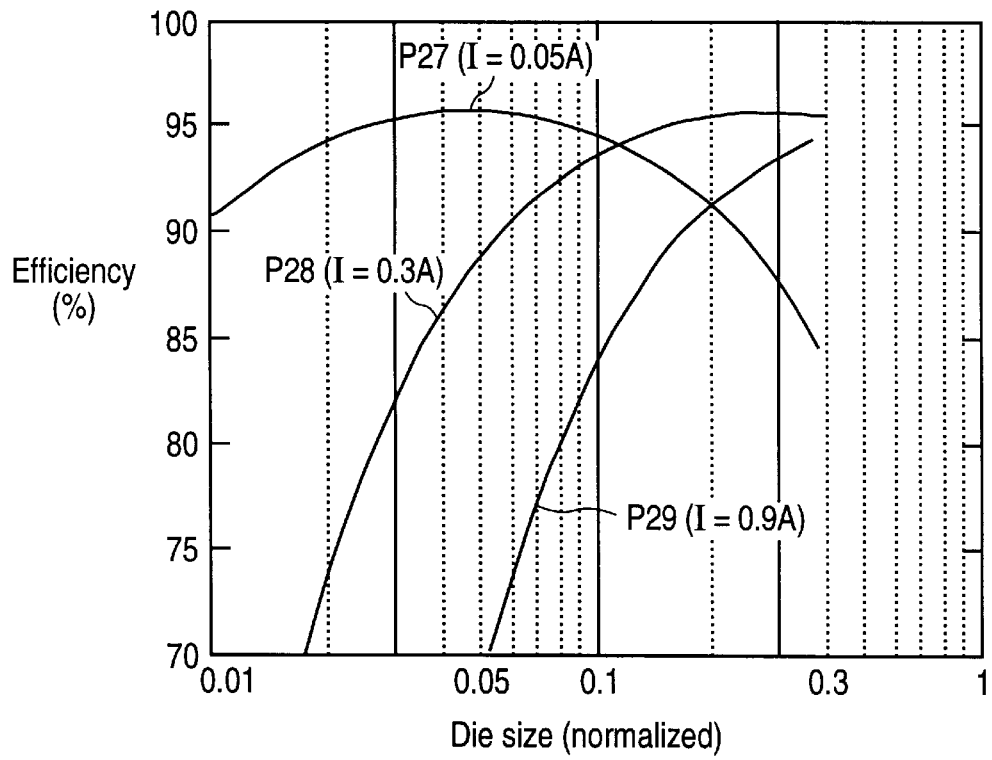
FIGS. 4I and 4J are graphs showing the same data as FIGS. 4G and 4H, respectively, plotted on semilog paper.
Figure 4J:
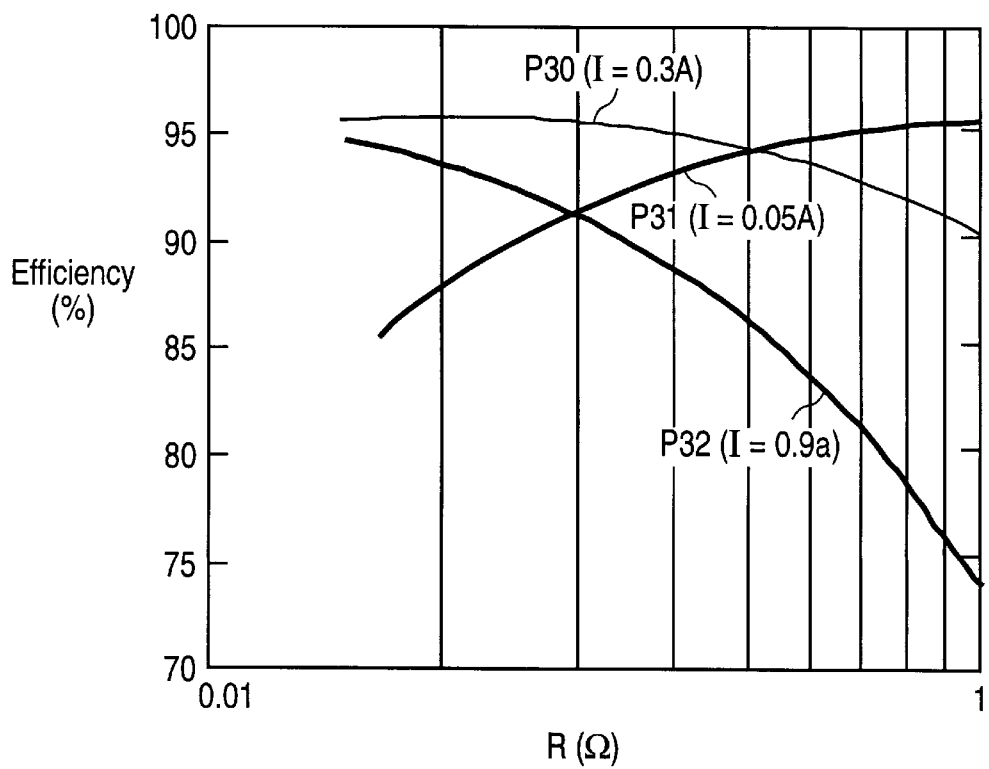
Figure 16:
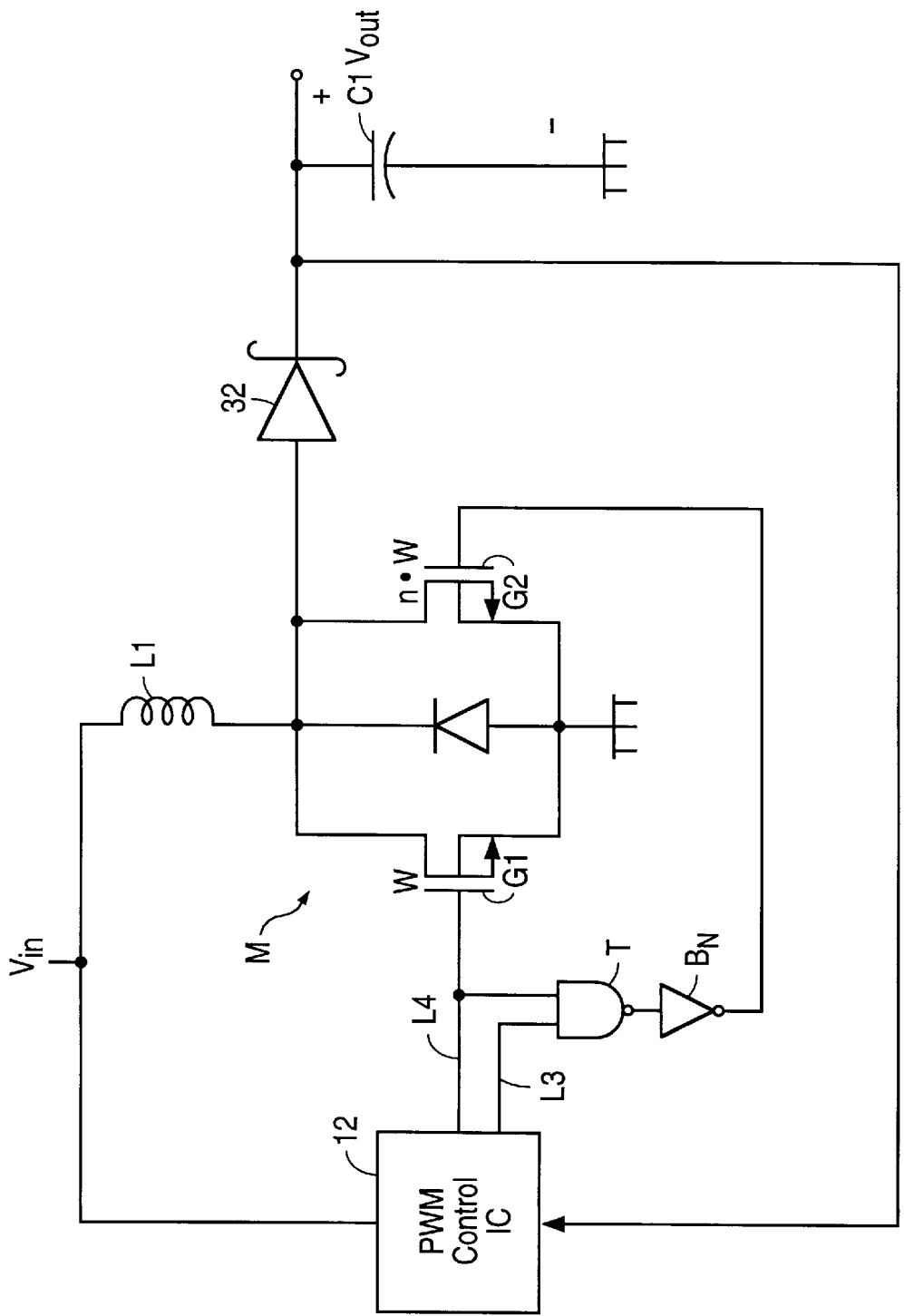
FIG. 16 is a circuit diagram of a boost converter in which an N-channel dual-gated MOSFET is used as a series switch.

FIG. 16 illustrates a circuit diagram of a dualgated MOSFET of this invention in a boost converter. The overall structure of the boost converter is similar to that shown in FIG. 3 except that the dual-gated MOSFET M is substituted for the MOSFET M5 and PWM control 12 delivers an enable signal on line L3 which controls whether the drive to gate G1 is also delivered to gate G2. When the enable signal is high, the gate drive on line L4 is passed through NAND gate T and buffer chain $B_N$ to gate G2. Conversely, when the enable signal is low, buffer chain $B_N$ delivers an output which turns gate G2 off. When the path from $V_{IN}$ to ground in interrupted, a voltage spike occurs at the anode of Schottky diode 32, and the energy stored in inductor L1 is transferred through Schottky diode 32 to charge storage capacitor C1. As a result, $V_{OUT}$ is typically higher than $V_{IN}$. In this circuit Schottky rectifier 32 can be replaced by an NMOS or PMOS synchronous rectifier which may be dual-gated if desired.

Figure 17:
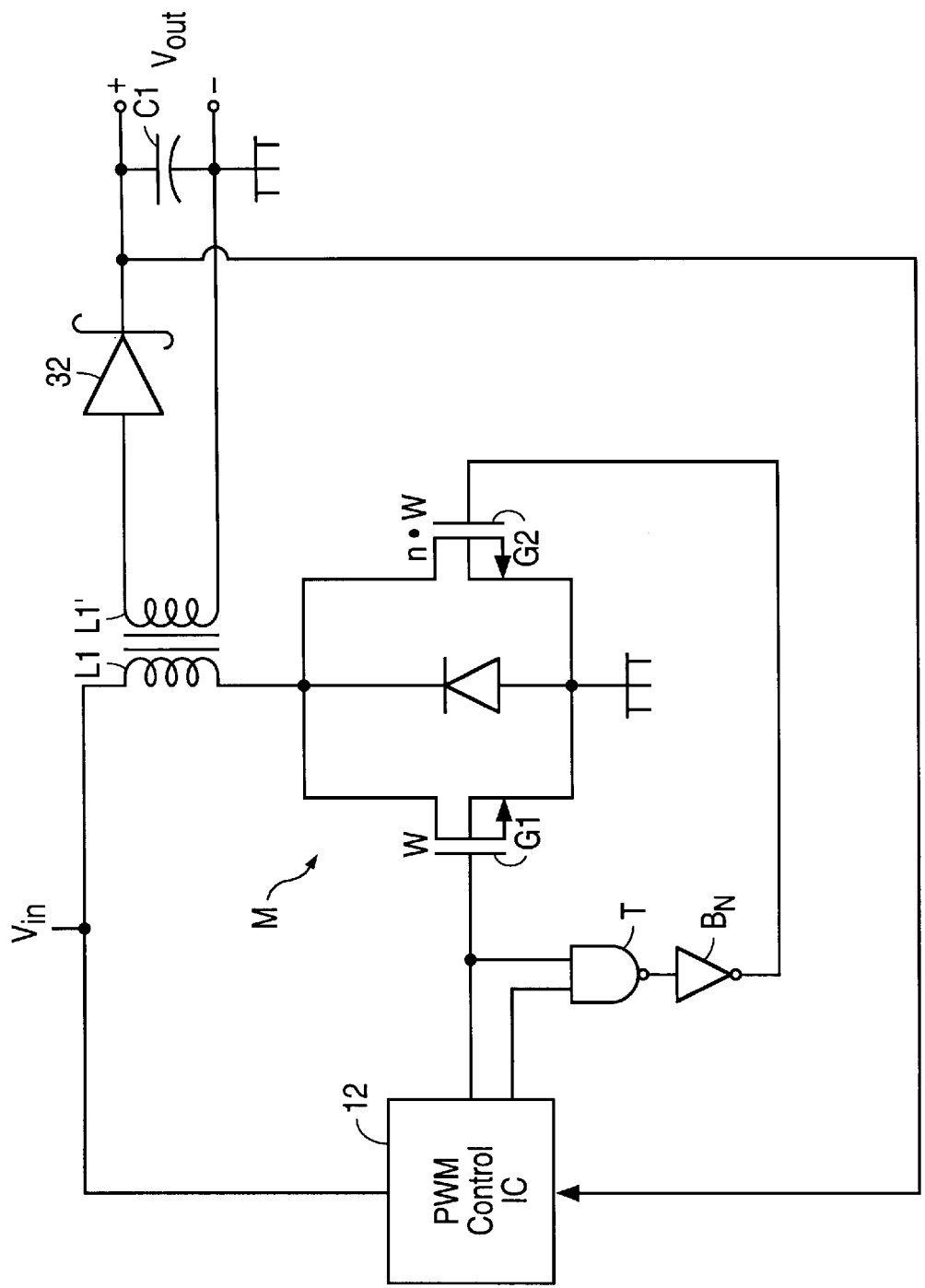
FIG. 17 is a circuit diagram of an alternative embodiment of a boost converter in which an N-channel dual-gated MOSFET is used as a series switch wherein the output voltage is delivered from the secondary winding of a transformer.

A circuit diagram of another embodiment of a boost converter is shown in FIG. 17. In this embodiment a secondary winding L1' is associated with inductor L1 which forms a primary winding of a transformer. Depending on the polarity of secondary winding L1' the boost converter operates either in a flyback or forward conduction mode.

FIGS. 18 through 25 illustrate several types of MOSFETs that can be constructed in accordance with this invention. It should be understood that the particular configurations shown in FIGS. 18 through 25 are illustrative only, and that numerous other embodiments may be constructed using the principles of this invention.

Figure 18:
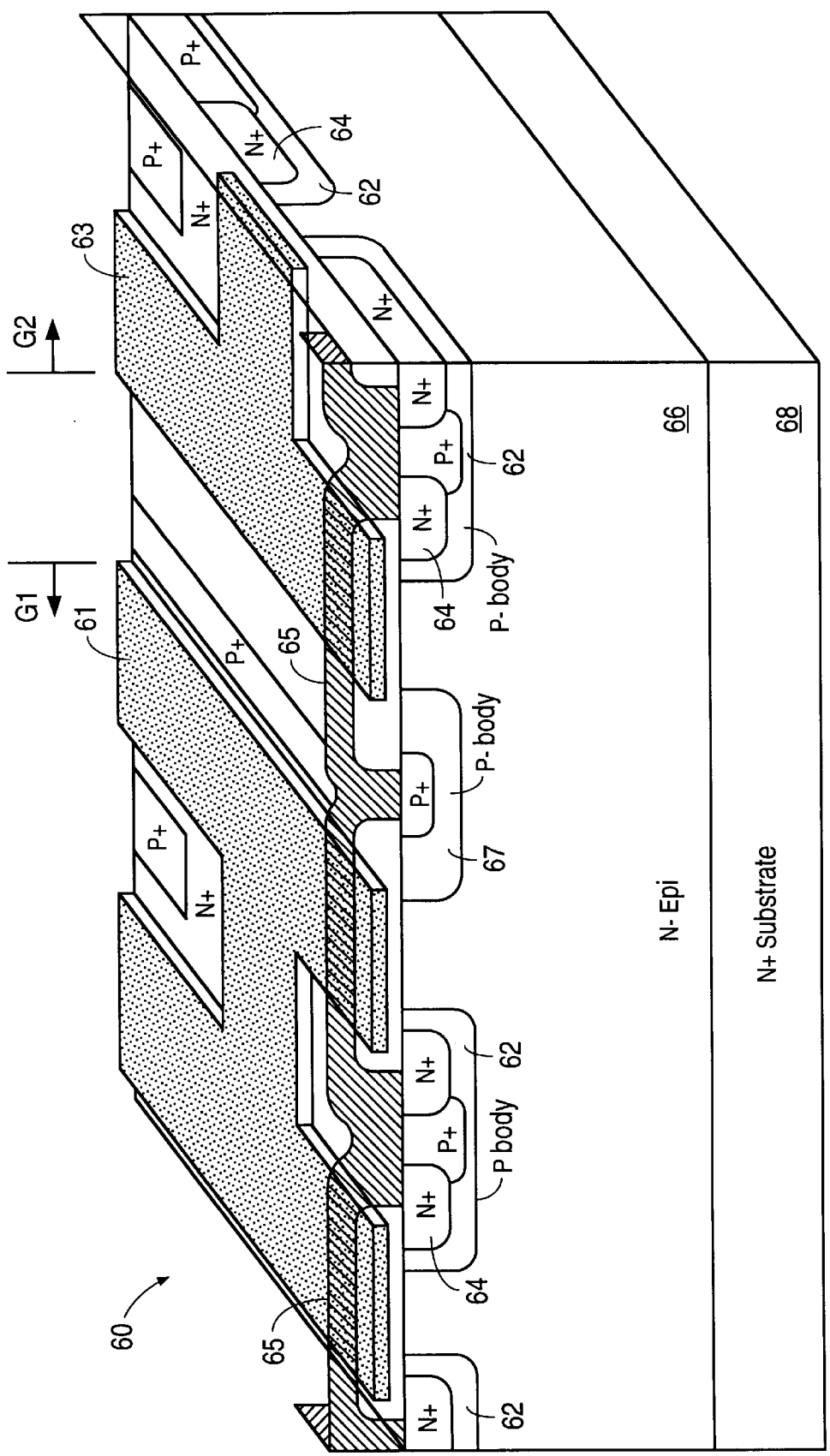
FIG. 18 is a three-dimensional cross-sectional view of a dual-gated vertical double-diffused MOSFET (DMOS).

FIG. 18 is a three-dimensional cross-sectional view of a vertical double-diffused MOSFET (DMOS) 60, which is formed in an N-epitaxial (epi) layer 66. Epi layer 66 is grown on an N+ substrate 68. MOSFET 60 includes individual cells arrayed on the surface of epi layer 66 in a polygonal pattern. Each cell includes a P-body diffusion 62 which encloses an N+ source region 64. N-epi layer 66 and N+ substrate 68 form the drain of MOSFET 60, and current flow takes place in channel regions at the surface of P-body diffusions 62. The N+ source regions 64 and the P-body diffusions 62 are shorted together by a metal layer 65.

The small gate (G1) of MOSFET 60 is represented as 61 and the large gate is represented as 63. Although not apparent from FIG. 18, gate 63 has a total width (approximated by the perimeters of the cells underlying gate 63) which is many times larger than the width of gate 61. Gates 61 and 63 are separated by a distinctive P-body diffusion 67 which does not contain a source region (and therefore carries no current) but is contacted by metal layer 65.

The current flows vertically from the top side contact through metal layer 65 into the N+ source region 64, through the P-body diffusion 62 and out the N+ substrate 68.

The fabrication sequence for MOSFET 60 starts with the N+ substrate 68 which could have a resistivity in the range of as low as one milliohm-centimeter to five milliohm-centimeters, typically, although it could be as high as 30 or 40 milliohm-centimeters, and a thickness of around 10 mils. N+ epi layer 66 is grown to a thickness of from 1 to 30 microns, most likely in the range of 5 to 10 microns. N+ epi layer 66 could be of a doped to a concentration of from $10^{14}$ $cm^{-3}$ to $10^{17}$ $cm^{-3}$, but most likely in the range of $10^{15}$ $cm^{-3}$.

A field oxide layer (not shown) is grown, typically 5,000 Å to 2 microns thick, generally by oxidation in steam at 900 to 1150° C. for anywhere from 10 minutes to as long as 3 hours. The field oxide layer is masked and removed from the active device areas. A thin gate oxide is grown, typically 100 to 1200 Å thick, in a dry oxidation process at 900° to 1100° C. for 20 minutes 4 hours. Typically a chorine source such as HCl or TCA (triclorathane) helps to stabilize the gate oxide from mobile charges.

After the gate oxide is grown a polysilicon layer (gates 61 and 63) is deposited by chemical vapor deposition. The polysilicon layer is from 3,000 to 10,000 Å thick, typically 5,000 Å. The polysilicon is doped by ion implantation or by predeposition (e.g., with phosphorous oxychloride known as POCL) typically to a range of 20 to 100 ohms per square. The polysilicon layer is then patterned and etched using photolithographic techniques to create the grid pattern of cells or stripes for the active device and to create the gap between the gates 61 and 63.

At that point P body regions 62 and 67 are implanted, using a boron implant of between 20 to 120 KeV at a dosage of $7 \times 10^{13}$ $cm^{-2}$ to $2 \times 10^{14}$ $cm^{-2}$. The body is driven in at 1000° to 1150° C. for from one hour to 20 hours (typically about 6 hours at 1100° C.). Once formed, the body regions could have a junction depth in the N epi layer 66 of from 1 micron in a very shallow device to as deep as 3 or 3.5 microns in a very deep device. Once the body is formed, the device is masked and the N+ regions 64 are formed with an arsenic implantation at an energy of 20 to 1000 KeV and a dosage of $1 \times 10_{15}$ $cm^{-2}$ to $1 \times 10^{16}$ $cm^{-2}$ (typically $5 \times 10^{15}$ $cm^{-2}$. This is followed by an anneal for from 10 minutes to 1 hour at 900° to 1000° C. Before the anneal a second implant of a lighter dose of boron, typically $1 \times 10^{14}$ $cm^{-2}$ to $1 \times 10^{15}$ $cm^{-2}$, at an energy of between 20 to 100 KeV may be performed to form the P+ regions.

After the anneal, an oxide is deposited to a thickness of a few hundred angstroms then another layer of oxide or BPSG using chemical vapor deposition. The chemical vapor deposition is performed to a thickness of between 5000 angstroms to 2 microns, typically one micron.

The wafer may then be heated for some period of time to cause that BPSG to flow and to smooth out the surface. The contact areas for the N+ source regions 64 and P+ regions and for the gates 61 and 63 are etched using a plasma or a reactive ion etch (RIE). The metalization layer 65, typically aluminum, is deposited over the entire wafer, which shorts out all the N+ source regions 64, the P-body diffusions 62, and the distinctive P-body diffusion 67. The metalization layer 65 also contacts the gates, but then the metalization layer is photolithographically masked and etched to remove it from the die edge and to disconnect the gates 61 and 63.

Figure 19:
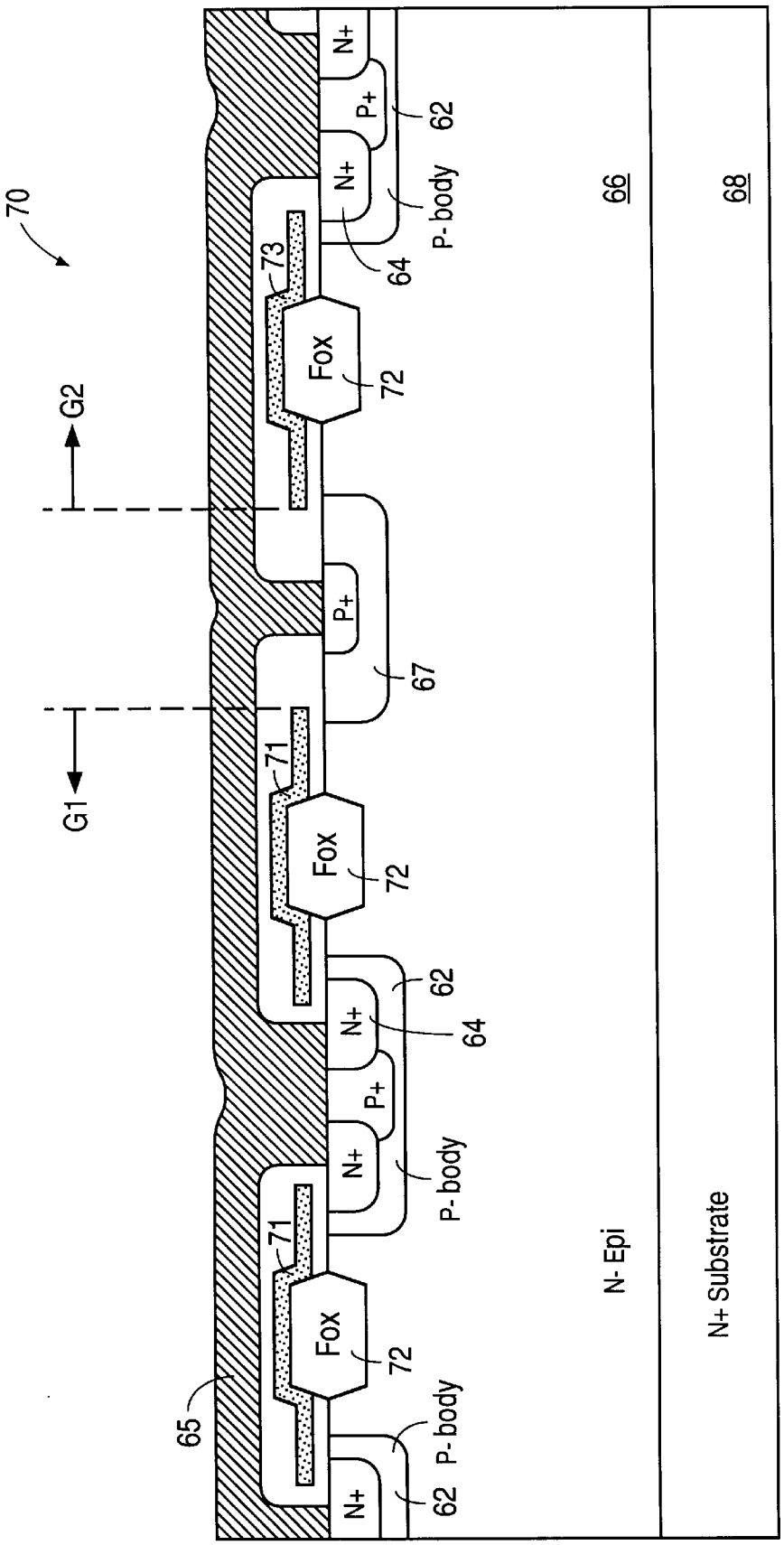
FIG. 19 is a cross-sectional view of a dual-gated vertical double-diffused MOSFET in which field oxide regions are interposed between adjacent P-body diffusions.

FIG. 19 is a cross-sectional view of a MOSFET 70 which is similar to MOSFET 60 but in which field oxide regions 72 are interposed between adjacent P-body diffusions 62, thereby altering the structure of small gate 71 and large gate 73. Field oxide regions 72 reduce the gate-to-drain overlap capacitance and reduce the charge on gates 71 and 73.

The fabrication process for MOSFET 70 is similar to that for MOSFET 60 (FIG. 18), except the field oxide is introduced into the cell so that the gate, instead of being flat over the thin gate oxide layer over the entire distance between each of the P-body regions 62 (or 67), now surmounts an intervening field oxide layer 72. The chief advantage of this structure is that the field oxide regions decrease the capacitance between the gate and the drain. This gate-drain capacitance causes can cause a power loss in high frequency switching circuits. Another advantage is that if a threshold adjust is performed, the threshold adjust is kept out of the region where the field oxide is located.

Figure 20:
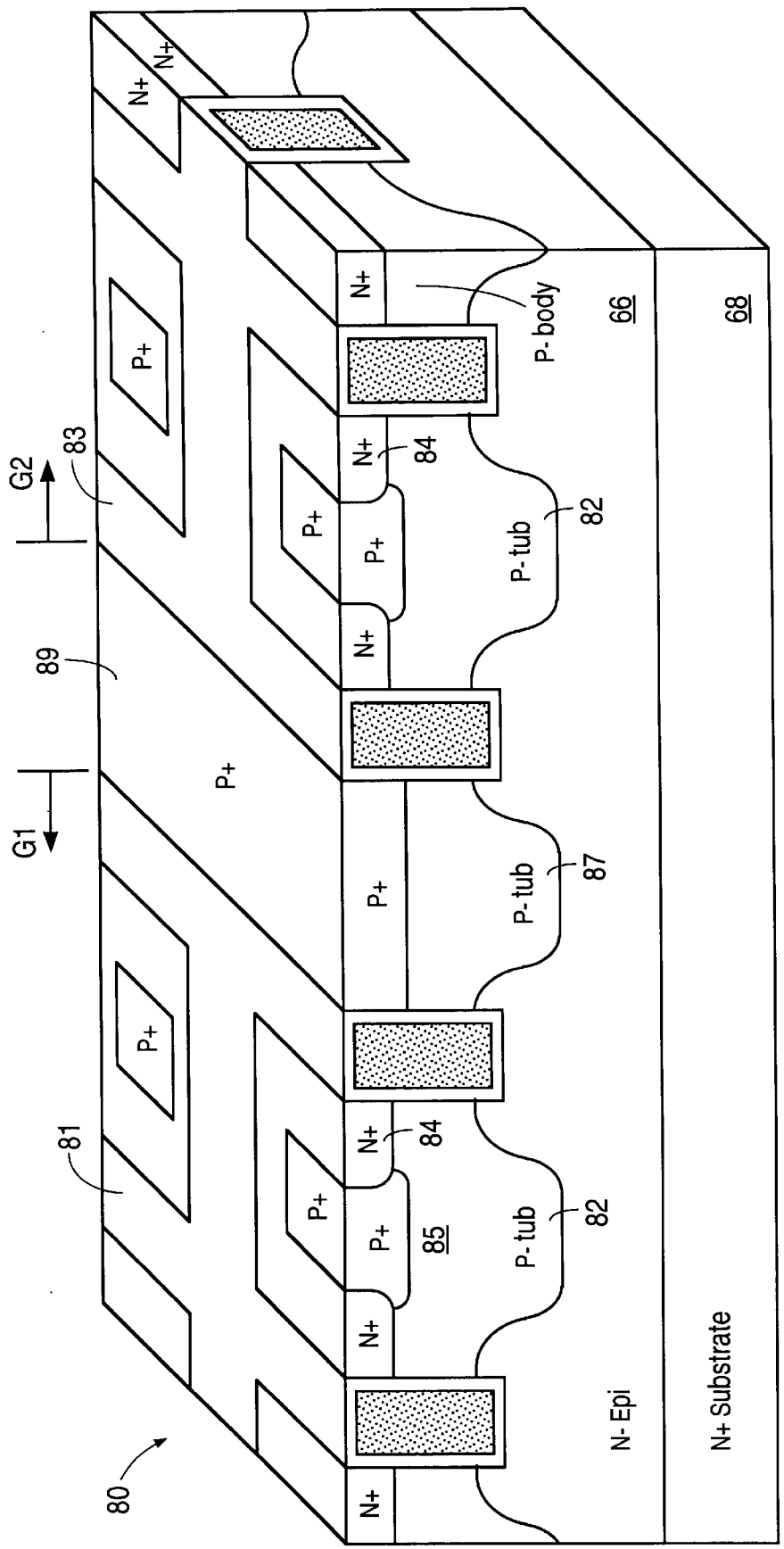
FIG. 20 is a three-dimensional cross-sectional view of double-diffused vertical MOSFET in which the small gate and the large gate are formed in a trench.

FIG. 20 is a three-dimensional cross-sectional view of double-diffused vertical MOSFET 80 in which the small gate 81 and the large gate 83 are formed in a trench. Each active cell of MOSFET 80 includes an N+ source region 84, a P-body diffusion 85 and a protective P-tub 82, which reduces the strength of the electric field at the corners of the trench and thereby prevents carrier generation and the resultant breakdown of the gate oxide layer. The N-epi layer 66 and N+ substrate 68 serve as the drain of the MOSFET. Current flows vertically through channel regions in the P-body diffusions adjacent the side walls of the trench.

Small gate 81 and large gate 83 are separated by a P-tub 87 which is similar to P-tubs 82 but does not abut a source region and therefore does not carry current. A surface P+ region 89 overlying P-tub 87 also separates gates 81 and 83.

Figure 21:
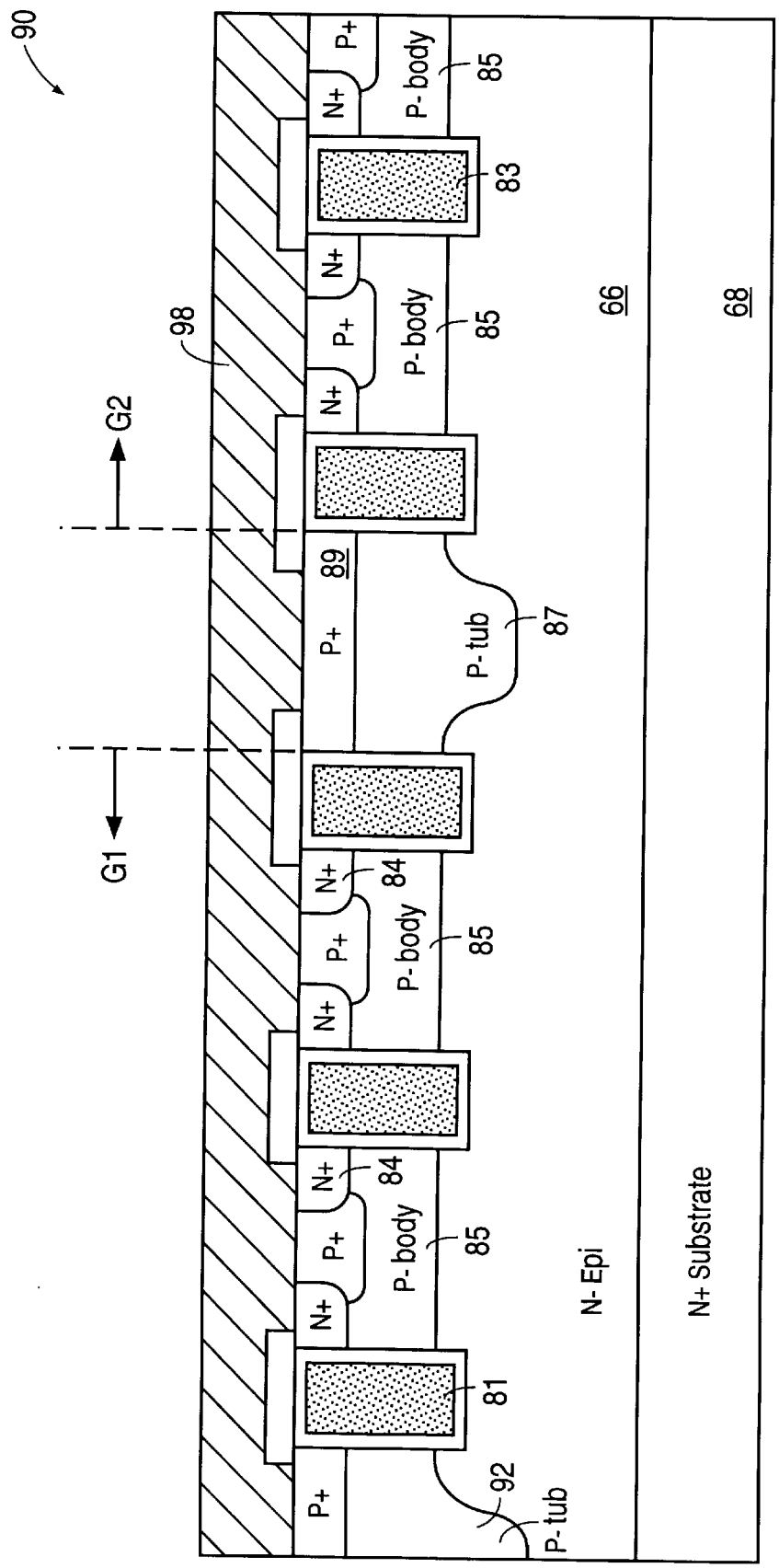
FIG. 21 is a cross-sectional view of a modified version of the MOSFET shown in FIG. 20.

FIG. 21 is a cross-sectional view of a modified version of MOSFET 80. In MOSFET 90, there is no protective P-tub in every cell. Instead, a protective P-tub 92 is formed in only a specified percentage of the active MOSFET cells as taught in application Ser. No. 08/459,555, filed Jun. 2, 1995, incorporated herein by reference in its entirety. This structure permits a greater cell density and reduces the on-resistance of the MOSFET. FIG. 21 also shows a metal layer 98 which shorts together P-tubs 87 and 92, P-body diffusions 85 and N+ source regions 84.

The fabrication process for MOSFETs 80 and 90 shown in FIGS. 20 and 21 is similar to that described in the above-referenced application Ser. No. 08/459,555. The main difference is that in the formation of MOSFETs 80 and 90 gates 81 and 83 are separated by etching the polysilicon layer, and the surface P+ region 89 and P-tub 87 are formed as an interposing layer to separate the two gates. The gates are connected to separate gate pads. The trenches which contain the two gates are also formed as two separate trenches.

Figure 22:
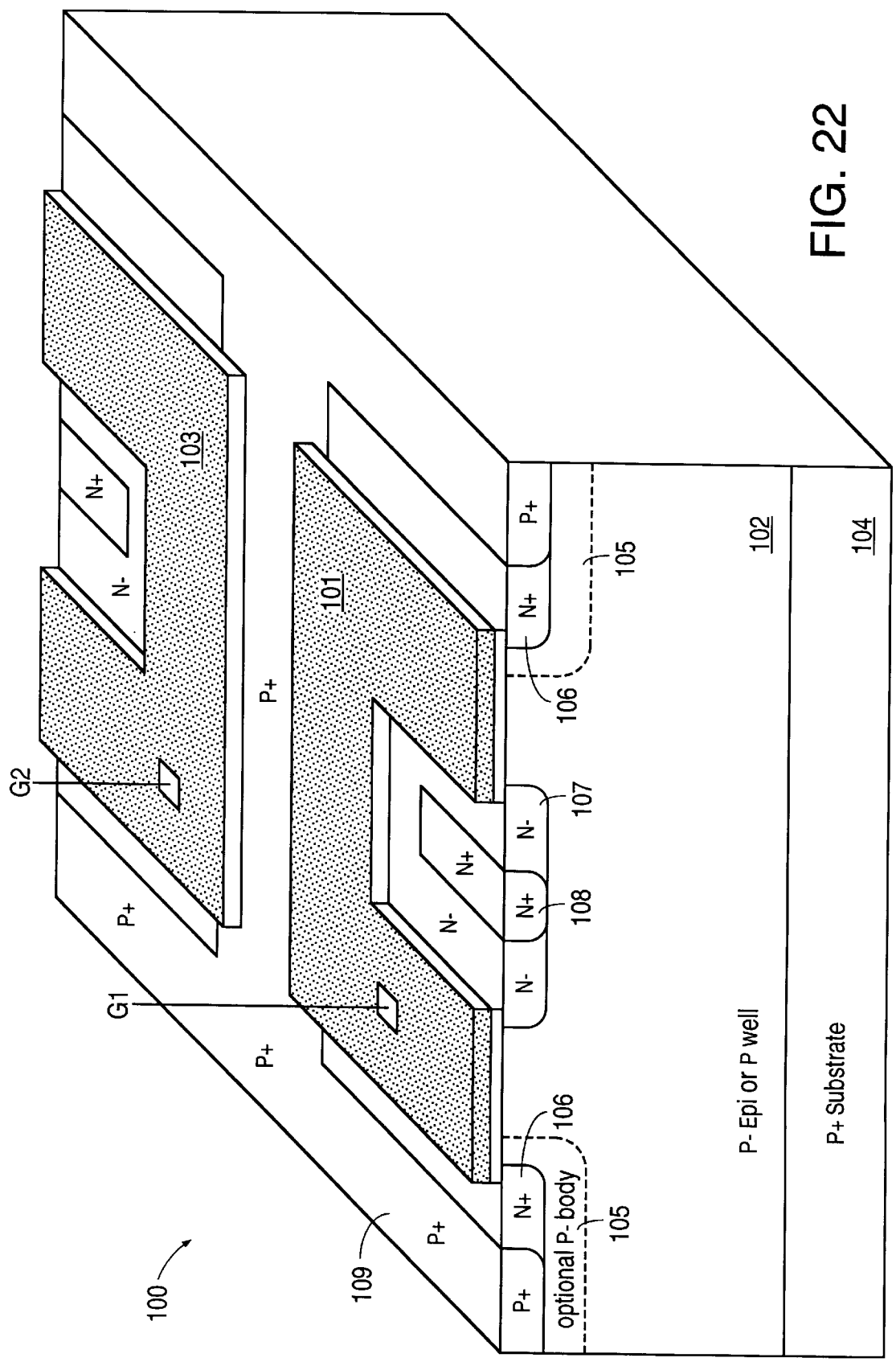
FIG. 22 is a three-dimensional cross-sectional view of a dual-gated lateral N-channel MOSFET formed in a stripe pattern.

FIG. 22 is a three-dimensional cross-sectional view of a lateral N-channel MOSFET 100 which is formed in a P-epi layer or P-well 102 overlying a P+ substrate 104. Current flows laterally near the surface of P-epi layer or P-well 102 in channel regions that are located between N+ source regions 106 and N+ drain regions 108. N-drift regions 107 which surround N+ drain regions 108 increase the ability of MOSFET 100 to block voltages. Optional P-body regions 105 may be formed around N+ source regions 106. A small gate 101 and a large gate 103 control current flow through the channel regions, gate 103 having a width many times the width of gate 101. Gates 101 and 103 are separated by an intervening P+ ring 109.

In fabricating MOSFET 100 one starts with a P+ substrate 104 having a resistivity of from 1 milliohm-centimeter to 0.1 ohm-centimeter. P-epi layer 102 is grown from 1 to 20 microns thick (typically 6 to 8 microns thick). In 60 volt processes, P-epi layer 102 could be 10 microns thick. P-epi layer 102 could be doped to a concentration of from $1 \times 10^{14}$ cm$^{-3}$ to $1 \times 10^{16}$ cm$^{-3}$. Alternatively, P-epi layer 102 could be doped to a lighter concentration and a well region, e.g., a boron region doped at a dosage of $1 \times 10^{13}$ cm$^{-2}$ to $1 \times 10^{14}$ cm$^{-2}$, could be formed and driven in at a temperature of from 1050 to 1200 C. (e.g., 1100 or 1150° C.) to a depth of from 2 to 5 microns. The net result is a well or epi region whose surface concentration would be somewhere in the range of $8 \times 10^{15}$ cm$^{-3}$ to $3 \times 10^{16}$ cm$^{-3}$.

A field oxide layer at the same range of thicknesses described in connection with MOSFET 60 (FIG. 18) is grown and patterned to define the active device regions. Alternatively, a low post-oxidation process of the kind well known in the industry could be used to form a field oxide layer having a thickness in the range of 5000 angstroms to 1 micron.

Once the active device areas have been defined, a gate oxide of the same specifications described above is grown. A polysilicon layer is deposited and doped in the same way described in connection with MOSFET 60 and the polysilicon layer is patterned into separate gates 101 and 103.

At this point a mask is formed and a blanket implant of N– drift region 107 is performed at a dosage of $1 \times 10^{12}$ cm$^{-2}$ to $7 \times 10^{12}$ cm$^{-2}$. This N– blanket implant is typically phosphorous although it could be arsenic. Another mask is formed to define the N+ source regions 108 which are implanted using arsenic typically at a dose of $1 \times 10^{15}$ cm$^{-2}$ to $7 \times 10^{15}$ cm$^{-2}$. This is followed by another mask step to define P+ ring 109 which is implanted at a dose of $7 \times 10^{14}$ cm$^{-2}$ to $7 \times 10^{15}$ cm$^{-2}$. The implants are at an energy in the range of 40 to 120 KeV.

After that succession of implants an anneal process is performed at roughly 900 to 1000° C. from 10 minutes to a couple of hours but generally a very short period of time. Alternatively a rapid thermal anneal could be performed.

The regions under the gates 101 and 103 may or may not be threshold adjusted. They could be a threshold adjusted with an implant of a dose of $5 \times 10^{11}$ cm$^{-2}$ to $1 \times 10^{12}$ cm$^{-2}$ using either boron or phosphorous to raise or lower the threshold. The threshold implant can be performed early in the process before the formation of the polysilicon layer at an energy of 20 to 60 KeV; or it could be performed later through the polysilicon layer at an energy of 200 to 350 KeV. The dose of the threshold implant is tailored to yield the desired threshold in a well known manner.

Figure 23:
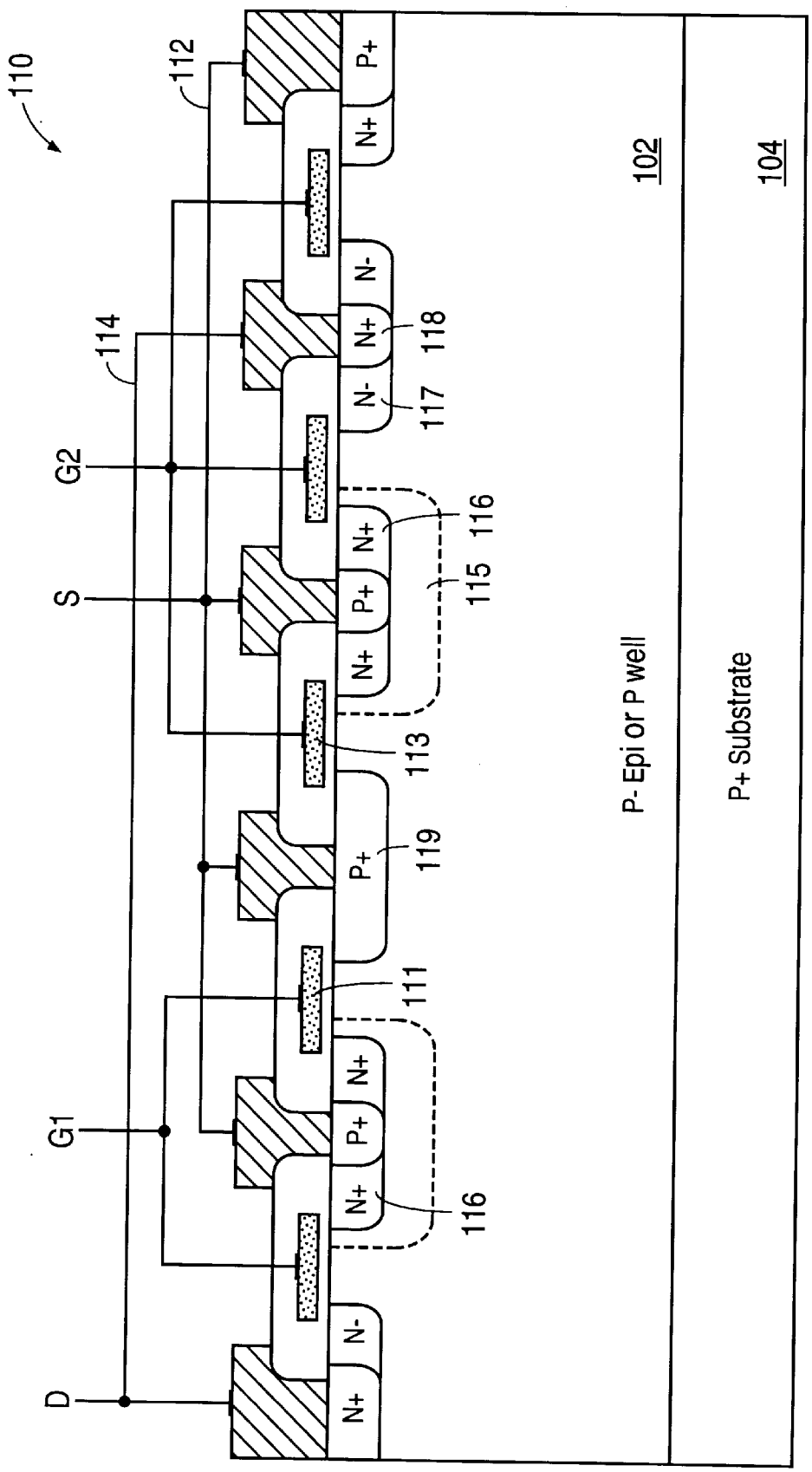
FIG. 23 is a cross-sectional view of a square-celled version of the MOSFET shown in FIG. 22.

MOSFET 100 shown in FIG. 22 is formed in a stripe pattern on the surface of P-epi or P-well 102. FIG. 23 is a cross-sectional view of a MOSFET 110, which is a square-celled version of MOSFET 100. FIG. 23 shows schematically how gates 111 and 113, N+ source regions 116, N+ drain regions 118 and P+ rings 119 are interconnected by metal layers over the surface of the silicon.

MOSFET 110 shown in FIG. 23 includes an optional P-body region 115. P-body region 115 is implanted, after the polysilicon is etched, at a dose of $1 \times 10^{13}$ cm$^{-2}$ to $1 \times 10^{14}$ cm$^{-2}$ and it is driven in for 1 to 12 hours at 1050 to 1150° C. to a junction depth of from 1.5 to 5 microns. P-body region 115 prevents punch-through in the device by increasing the charge in the P-epi or P-well region 102 so that the channel length and on-resistance of the MOSFET are reduced. P+ ring 119 separates the two gates G1 and G2 electrically.

Figure 24:
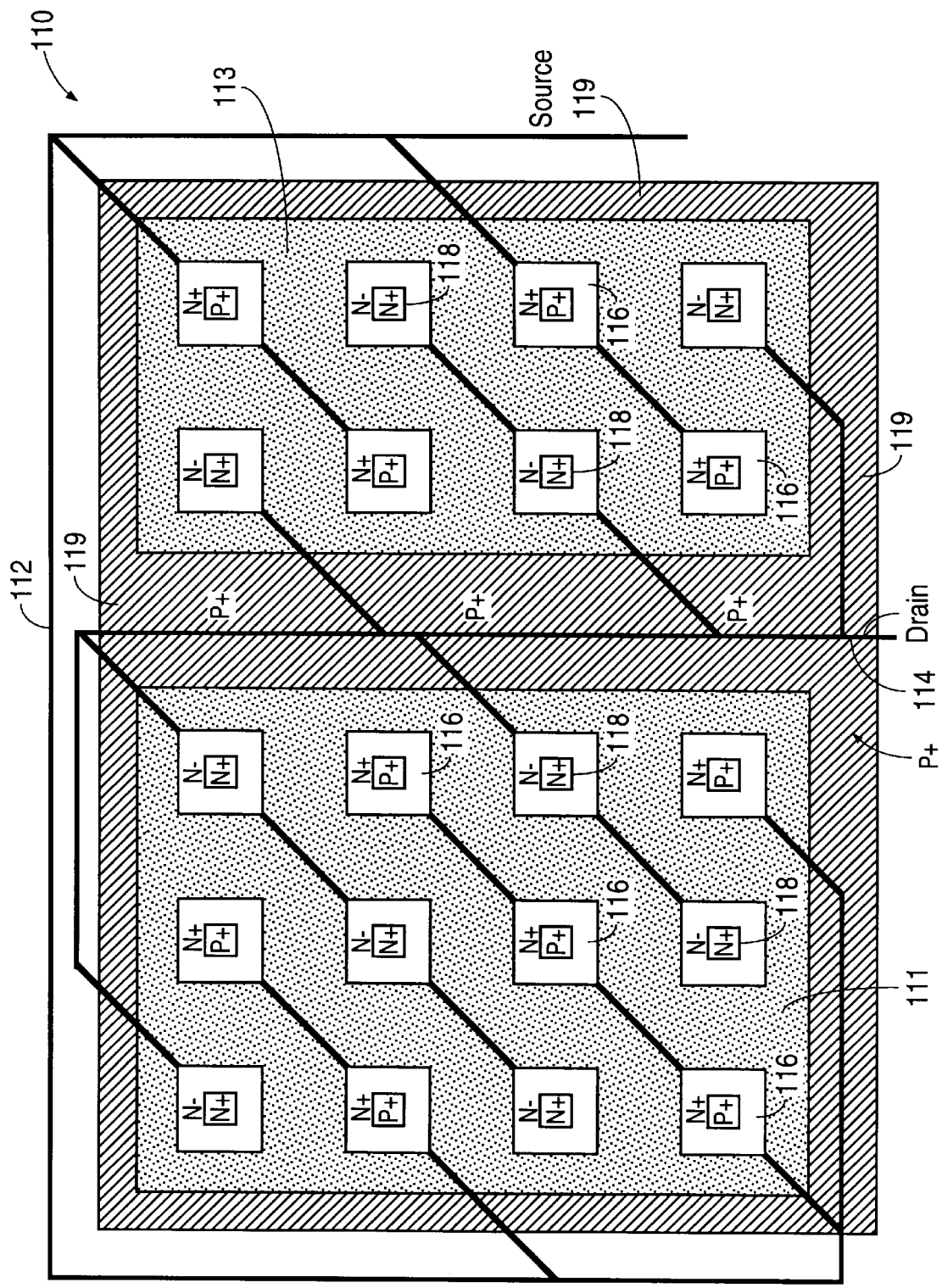
FIG. 24 is a plan view of the MOSFET shown in FIG. 23.

FIG. 24 is a plan view of MOSFET 110, showing the extent of gates 111 and 113 and how interdigitated source metal lines 112 and drain metal lines 114 extend diagonally across the surface of the MOSFET in the manner taught in U.S. Pat. No. 5,412,239, issued May 2, 1995. For purposes of clarity, the metal lines 112 and 114 are broken over the MOSFET cells themselves. FIG. 24 also shows that P+ region 119 forms a river or channel between the two gates to separate the two gates. The gate on the left, for example, might be a large gate and the gate on the right would then be a small gate.

Figure 25:
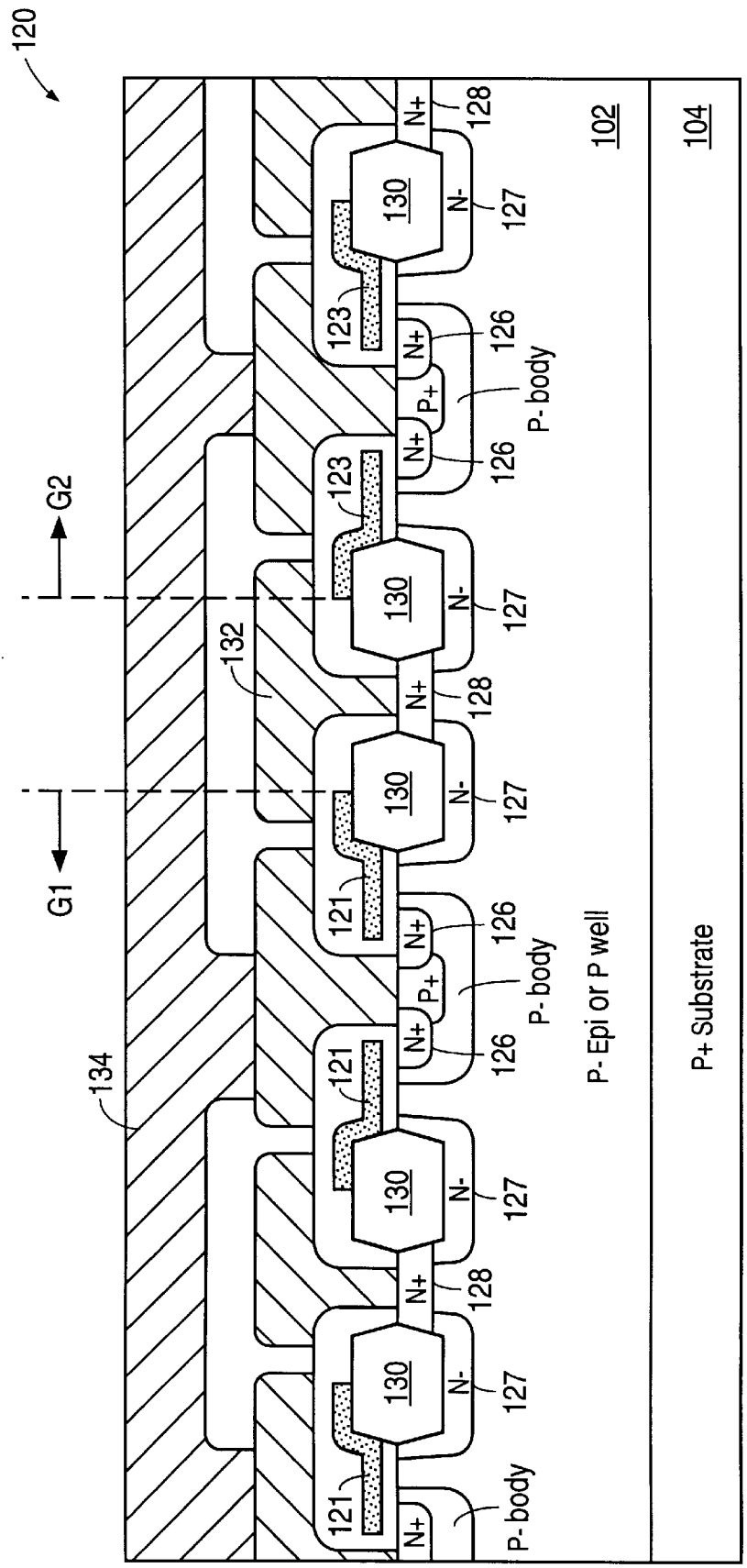
FIG. 25 is a cross-sectional view of a dual-gated lateral DMOSFET with field oxide regions overlying its drift regions.

FIG. 25 is a cross-sectional view of a lateral DMOSFET 120 which is formed with field oxide regions 130, which are 5000 angstroms to a micron thick, for example. Overlying the N– drift regions 127. A small gate 121 and a large gate 123 overlap the field oxide regions 130. A drain metal layer 132 contacts N+ drain regions 128, and a source metal layer 134 contacts N+ source regions 126. Lateral DMOSFET 120 is fabricated using the process described above to form the P-body. Then, field oxide regions 130 are interposed between the source-body regions and the N+ drain regions using a LOCOS process. Additional dopant is placed underneath the field oxide in the LOCOS sequence, which may or may not be the field dopant used in other CMOS portions of the circuit. N-drift regions 127 could be either blanket or mask implanted prior to or during the forming of field oxide regions 130 using a dose in the range of $1\times10^{12}$ cm$^{-2}$ to $1\times10^{13}$ cm$^{-2}$ at an energy of 20 to 100 KeV. The N-drift regions 127 would be typically prevented from going into regions that are later to become active regions by a layer of silicon nitride used in forming the LOCOS process sequence.

References herein to a "full" or "light" load condition refer generally to operation with high or low load currents. The magnitude of the current that is defined as "low" or "light" varies with the application, but it is commonly any current that is less than ⅓ or ¼ of the average load current during normal operation and roughly an order of magnitude less than the peak current during normal operation. For example, a 300 mA converter may have peak demands of 1 A and go into light load operation at 80 or 90 mA.

A light load condition may be detected by monitoring the load current with a current sensing resistor, by using a current mirror or sense-FET type power device, or by sensing the voltage drop across a conducting MOSFET.

Figure 26:
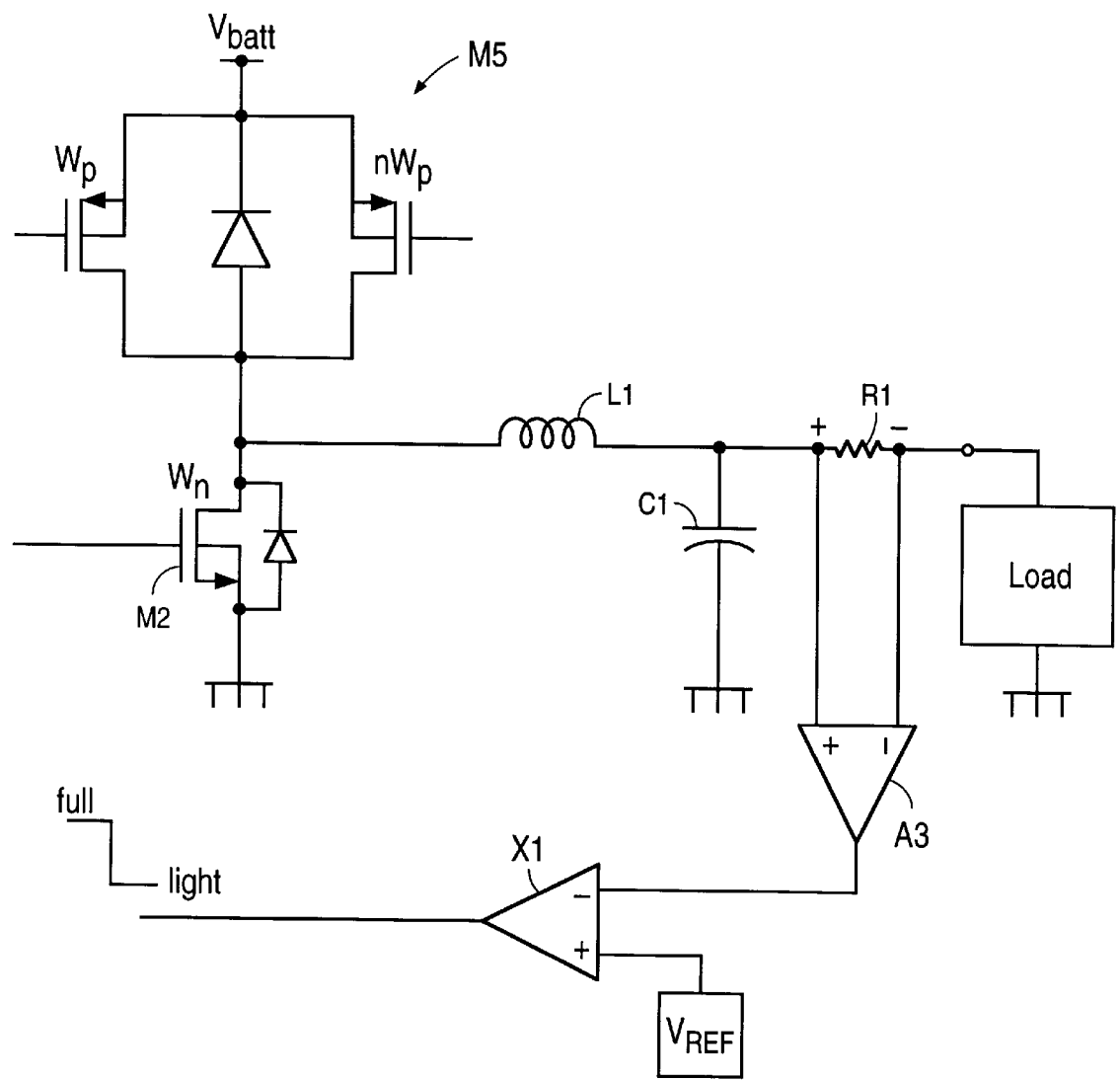
FIG. 26 illustrates a circuit diagram of an arrangement for detecting a light load condition by detecting the voltage drop across a resistor connected in the load line.

In FIG. 26, for example, a voltage across a resistor R1 indicates the magnitude of the load current and is delivered to the inputs of a buffer A3. A comparator X1 compares the output of buffer A3 to a reference voltage $V_{REF}$ and delivers a high signal representing a full load or a low signal representing a light load.

Figure 27:
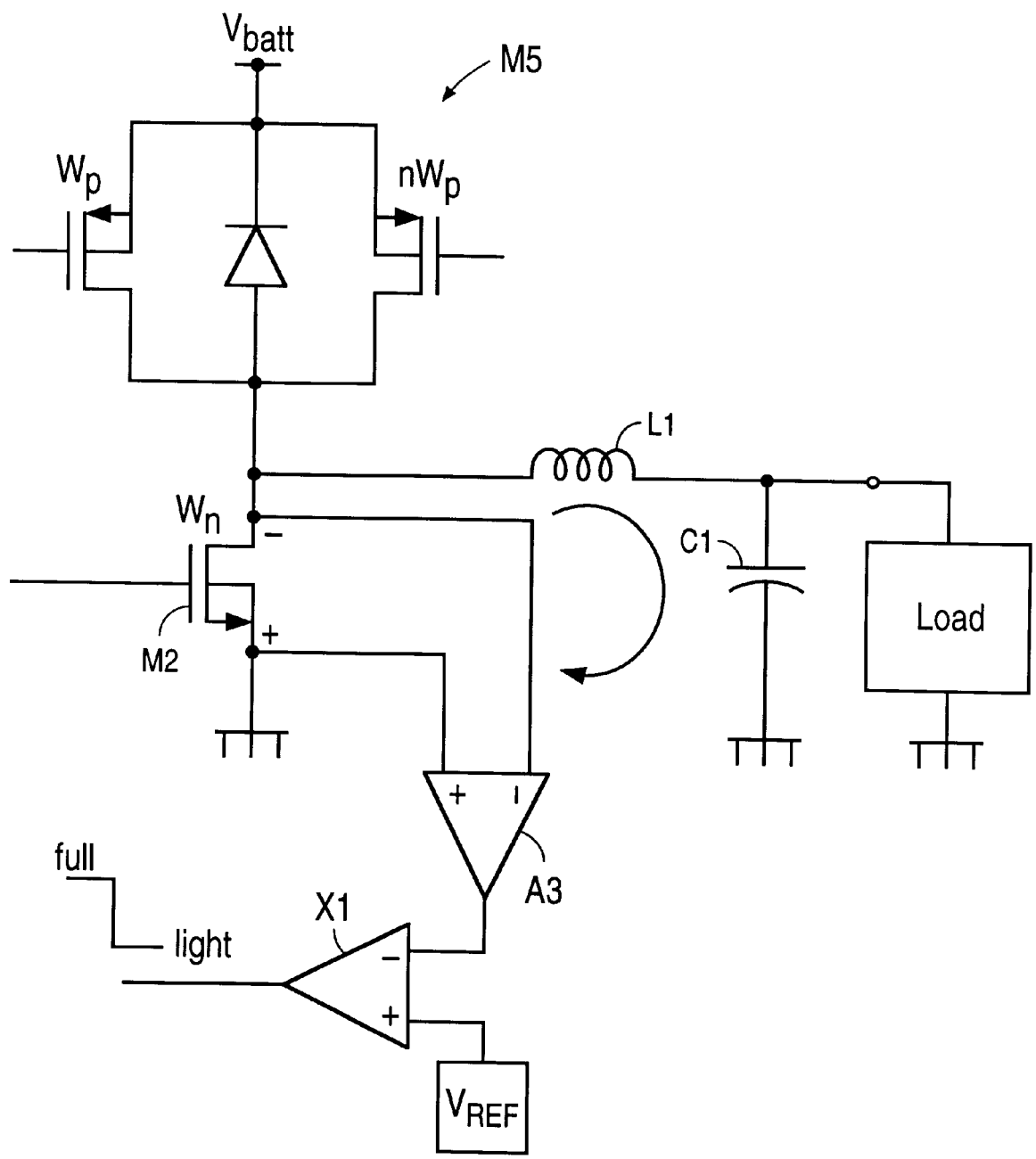
FIG. 27 illustrates a circuit diagram of an arrangement for detecting a light load condition by detecting the voltage drop across the synchronous rectifier.
Figure 28:
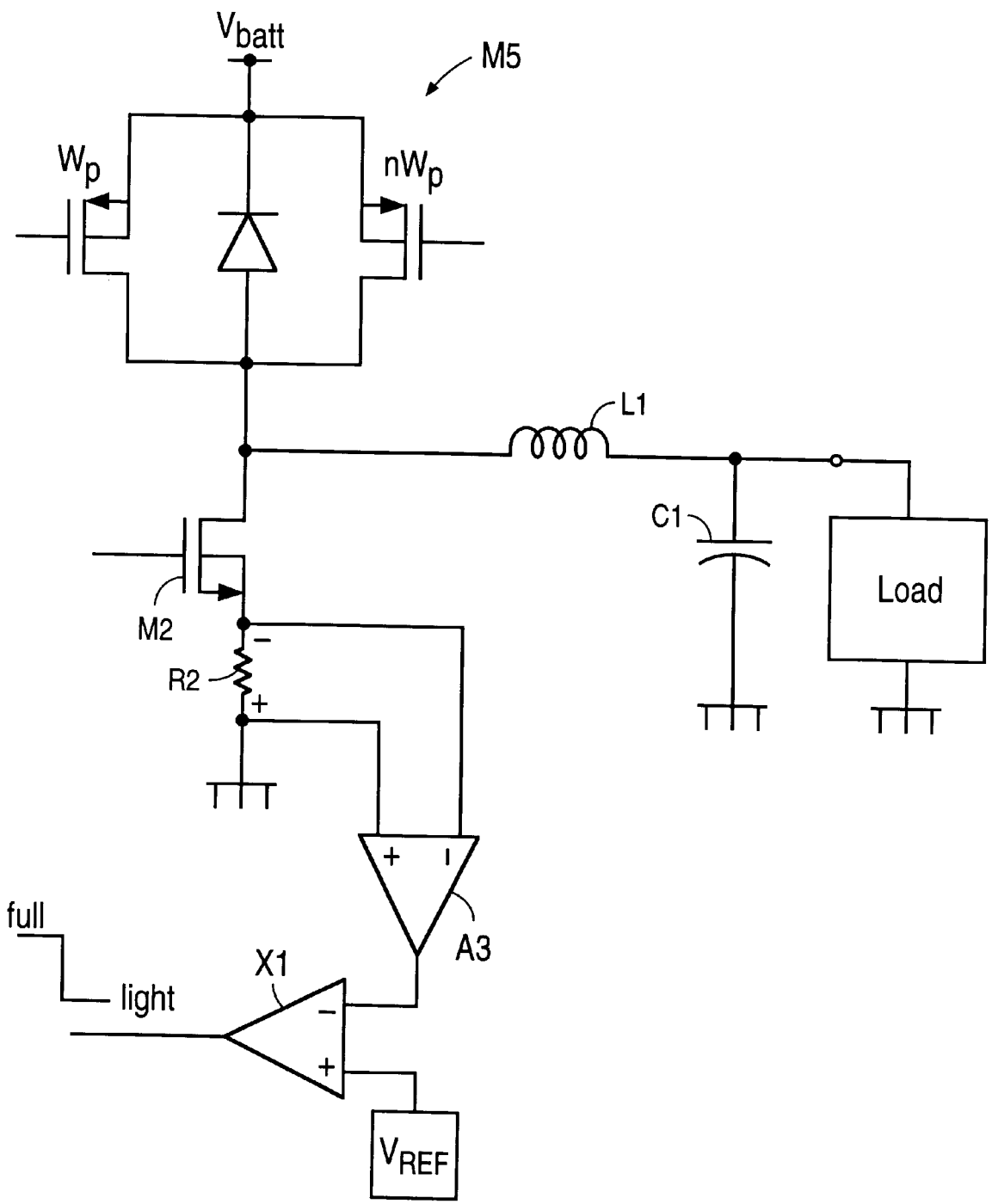
FIG. 28 illustrates a circuit diagram of an arrangement for detecting a light load condition by detecting the voltage drop across a resistor connected to the synchronous rectifier.
Figure 29:
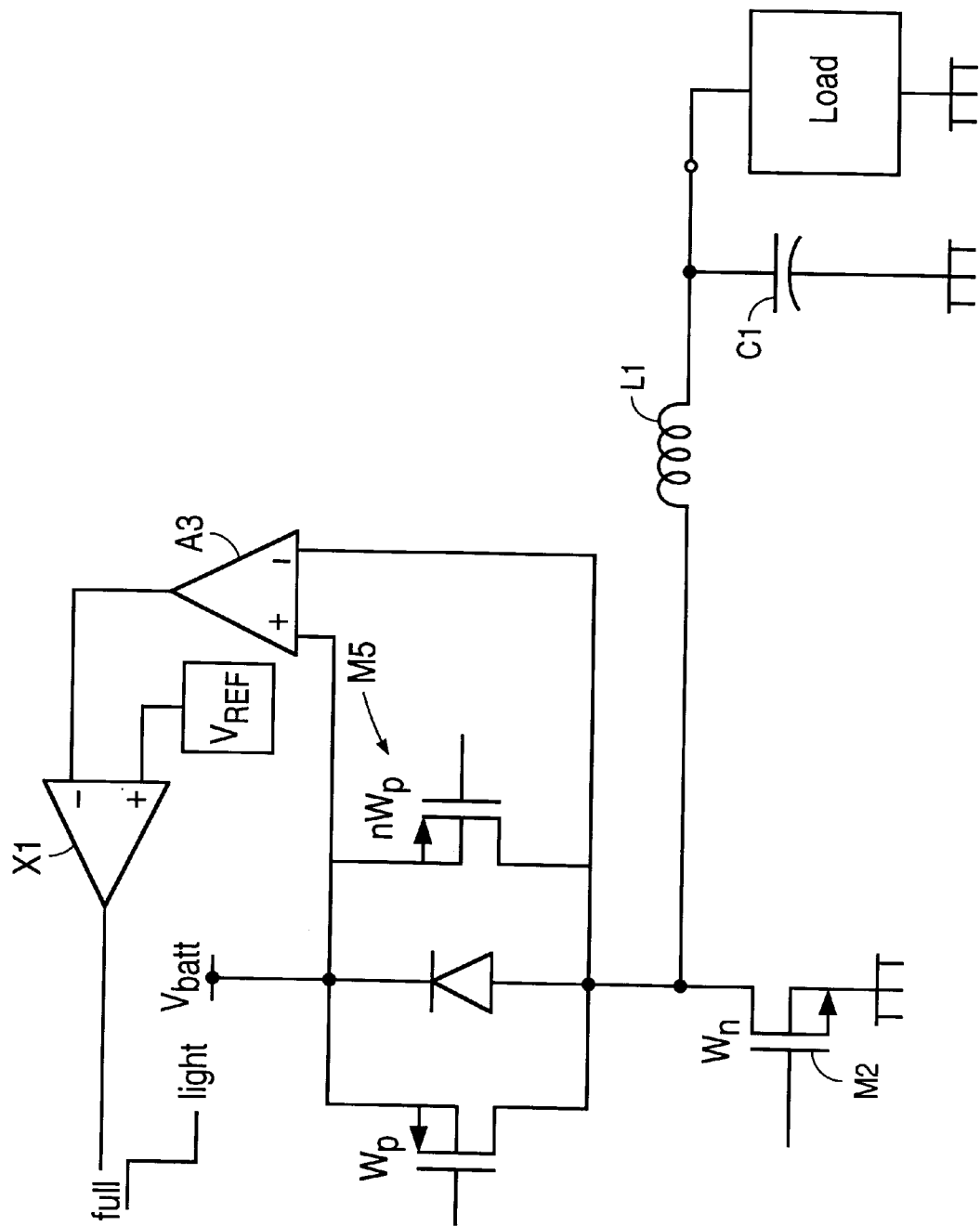
FIG. 29 illustrates a circuit diagram of an arrangement for detecting a light load condition by detecting the voltage drop across the high-side switch device.
Figure 30:
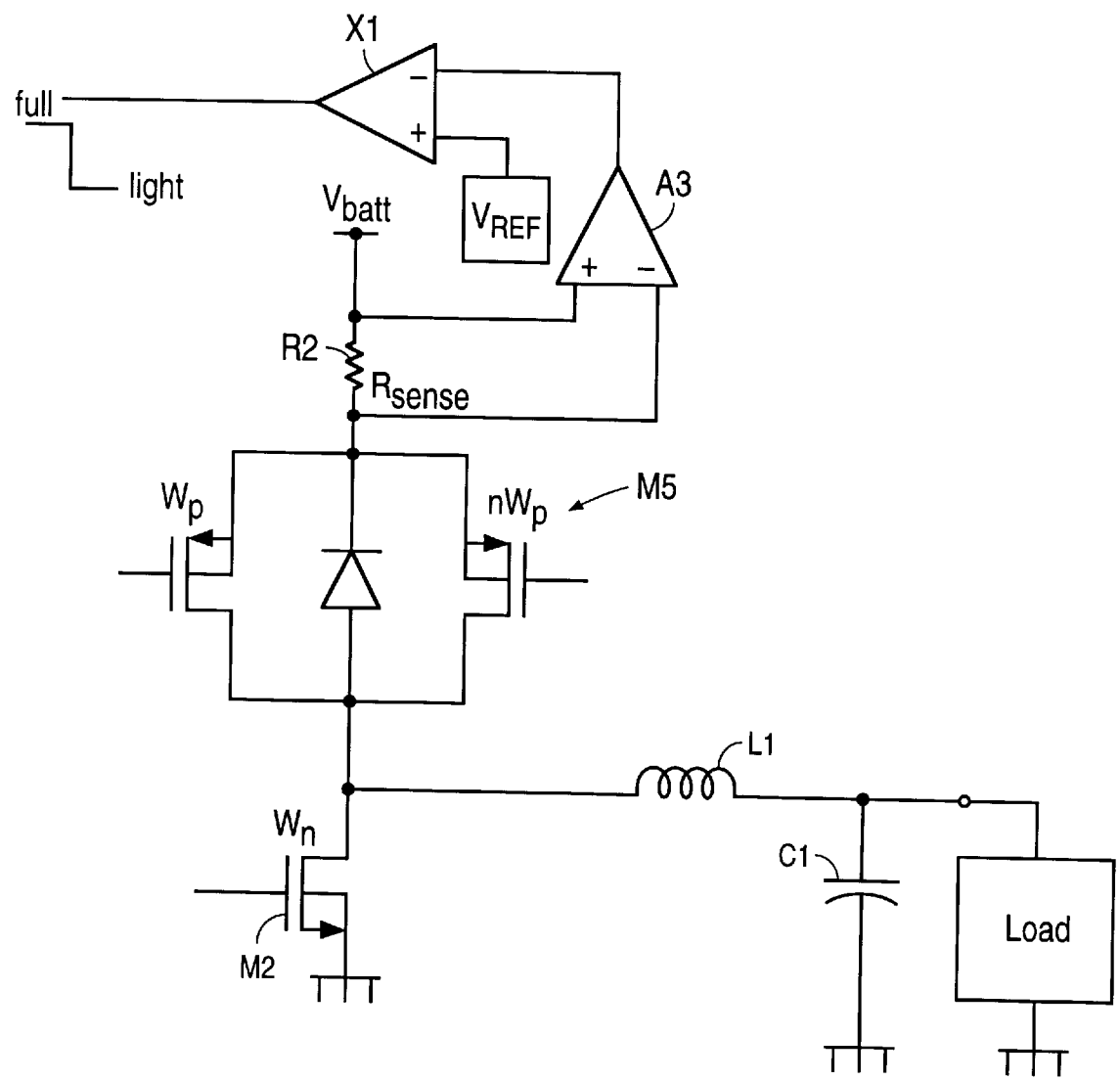
FIG. 30 illustrates a circuit diagram of an arrangement for detecting a light load condition by detecting the voltage drop across a resistor connected to the high-side switch device.

FIG. 27 illustrates a circuit in which the load current is detected by measuring the voltage drop across N-channel MOSFET M2 which acts as a synchronous rectifier. When the voltage drop falls below a prescribed value of $R_{DS}$ (on)×$I_{light\ load}$ then the comparator trips and turns off MOSFET M2, the $W_p$-sized gate of dual-gated P-channel MOSFET M5, or both, for one-half clock cycle, a full clock cycle or several clock cycles. FIG. 28 shows a similar arrangement except that the current is sensed with a sense resistor R2 which is connected to the source terminal of MOSFET M2. FIGS. 29 and 30 show a arrangement which is similar to FIGS. 27 and 28, respectively, except that the high-side MOSFET M5 is used instead of the low-side MOSFET M2 as a means of detecting the size of the load current. Although high-side MOSFET is shown as a P-channel device, an N-channel device could also be used.

Figure 31:
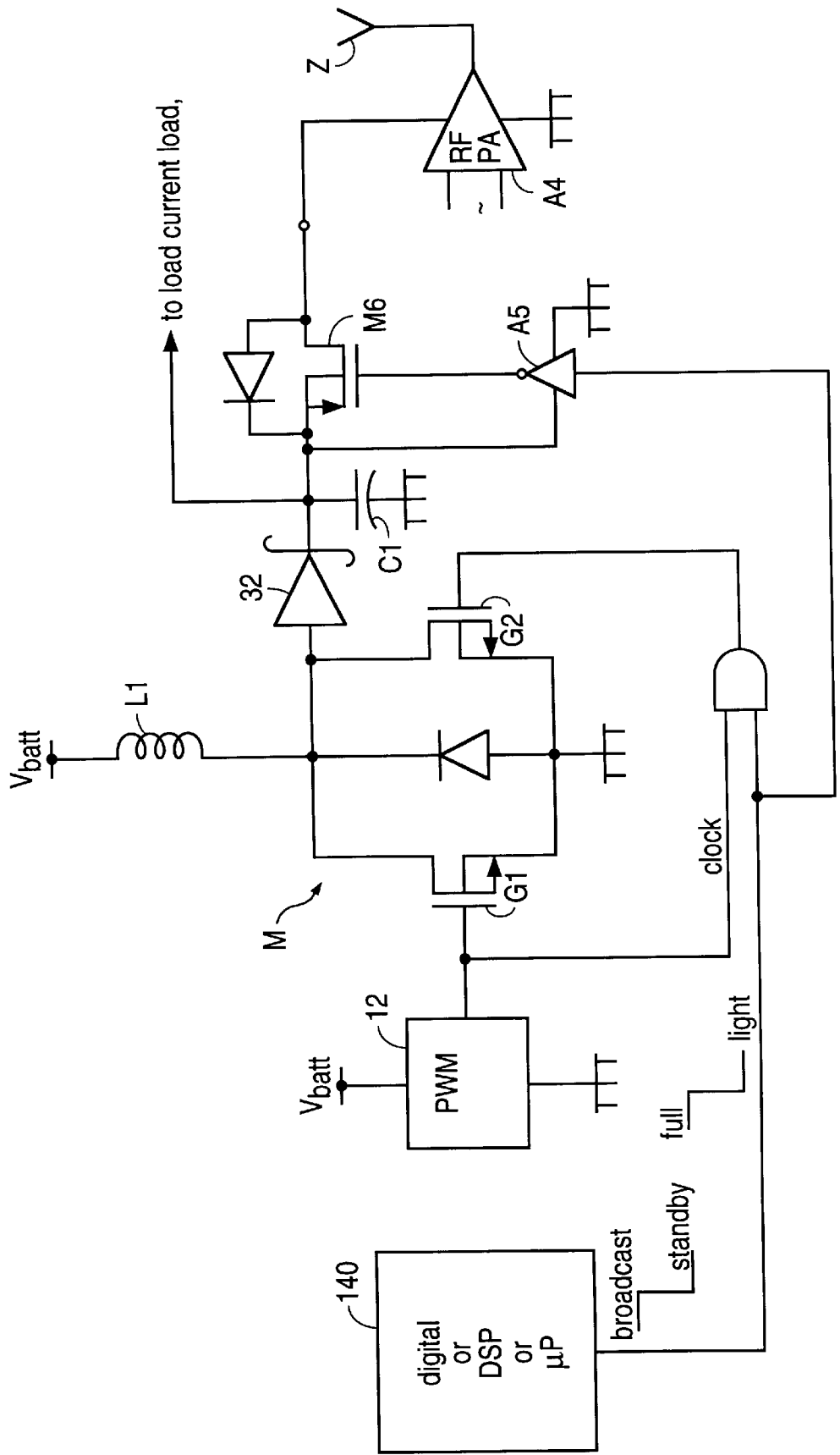
FIG. 31 illustrates a circuit diagram of an arrangement which includes both a dual-gated MOSFET and a load switch.

FIG. 31 illustrates several features which according to an aspect of this invention can be used in conjunction with the switching of a multiple-gated MOSFET. In this case the load is an RF power amplifier A4 for a cell phone which is connected to an antenna Z. A digital signal processor or microprocessor 140 delivers a high signal during a broadcast mode and a low signal during a standby or sleep condition. This signal is input to an inverter A5 which drives a P-channel MOSFET M6 so as to connect the converter to RF amplifier A4 during broadcast and disconnect it during standby. The output of microprocessor 140 is also delivered to an AND gate where it controls whether the gate drive (clock) reaches the large gate G2 of the dual-gated MOSFET M. A combination dual-gated device (M) and a load switch (M6) provide a means to guarantee a low load current (e.g., a few nA) and good light efficiency (on other loads) without sacrificing response time and regulation. Furthermore, FIG. 31 illustrates how in a switched light-load system a controller (140) can decide the level of power consumption in the first place, rather than detecting it.

Figure 32:
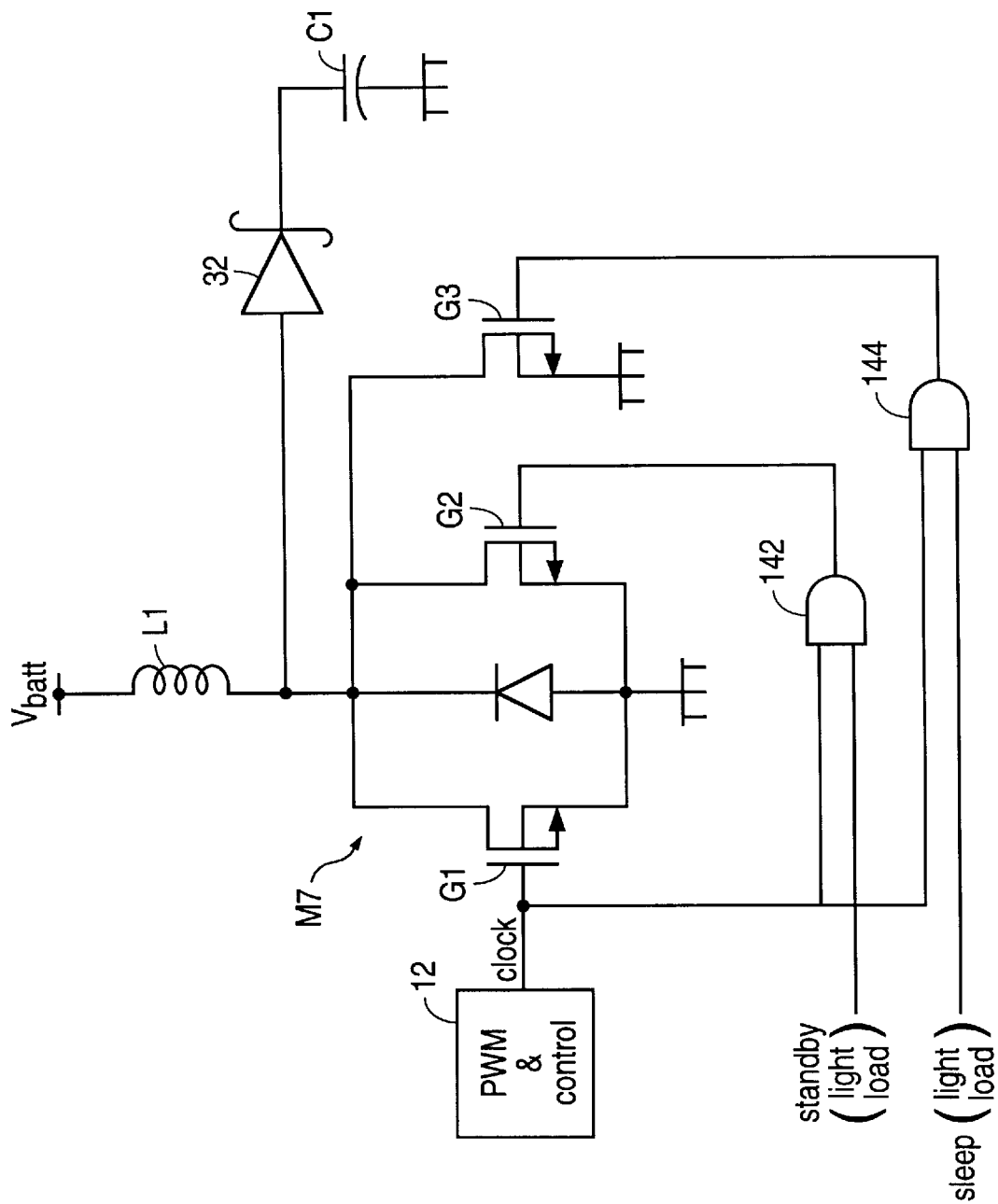
FIG. 32 illustrates a circuit diagram of a triple-gated MOSFET adaptable to satisfy a plurality of load conditions.

FIG. 32 illustrates an arrangement in which a multiple-gated MOSFET can operate in three or more modes, using different current values or logic states as transition points. In triple-gated MOSFET M7, gate G1 is the smallest gate, gate G2 is an intermediate-sized gate, and gate G3 is the largest gate. The clock signals to gates G2 and G3 are controlled by AND gates 142 and 144, respectively. Table 2 illustrates a possible scheme for controlling gates G1, G2 and G3 during sleep, standby, run and transmit conditions.

TABLE 2

| Condition | Gate G1 | Gate G2 | Gate G3 | Clock |
|---|---|---|---|---|
| Sleep | Off | Off | Off | 20 kHz |
| Standby | Switching | Off | Off | 1 MHz |
| Run | Either | Switching | Off | 1 MHz |
| Transmit | Either | Switching | Switching | 1 MHz |

The specific embodiments of this invention described above are intended to be illustrative only, and are not intended to limit the broad scope of this invention, which is defined in the following claims.

I claim:

1. A multiple gated MOSFET comprising a source, a drain, a body, first and second gates, and a gate control, said first gate having a gate width that is different from a gate width of said second gate, said first gate being connected to an output terminal of said gate control, said second gate being connected to said output terminal through a switch, said first and second gates being electrically isolated from each other when said switch is open, wherein said body is shorted to said source.

2. The MOSFET of claim 1 wherein said gate control comprises a pulse width modulation unit.

3. The MOSFET of claim 1 further comprising at least one inverter connected between said pulse width modulation unit and said first gate and at least two inverters connected between said pulse width modulation unit and said second gate, a number of inverters connected to said second gate being greater than a number of inverters connected to said first gate.

4. The MOSFET of claim 3 wherein said switch comprises a NAND gate.

5. The MOSFET of claim 1 wherein said MOSFET is in the form of a vertical double-diffused MOSFET.

6. The MOSFET of claim 1 wherein said MOSFET is in the form of a vertical trench-gated MOSFET.

7. The MOSFET of claim 1 wherein said MOSFET is in the form of a lateral MOSFET.

8. The MOSFET of claim 7 wherein the MOSFET comprises a drain which includes a drift region having a lower doping concentration than a doping concentration of a remaining portion of said drain.

9. The MOSFET of claim 8 wherein a field oxide region overlies at least a portion of said drift region.

10. A synchronous buck converter comprising an N-channel MOSFET and a P-channel MOSFET connected in series to a voltage supply, a gate control unit for driving a gate of each said MOSFETS, and an inductor connected to a midpoint between said N-channel and P-channel MOSFETs, wherein at least one of said MOSFETs comprises:

a source, a drain, a body, said gate being divided into first and second portions, said first portion having a gate width that is smaller than a gate width of said second portion, said first portion being connected to an output terminal of said gate control unit, said second portion being connected to said output terminal through a switch, said first and second portions being electrically isolated from each other when said switch is open.

11. The synchronous buck converter of claim 10 wherein said gate control unit comprises a pulse width modulation unit.

12. The synchronous buck converter of claim 10 wherein an output of said converter is connected to said gate control unit, said gate control unit operating said switch so as to disconnect said second portion of said gate from a gate drive output of said gate control unit when a high current condition exists at said output of said converter and to connect second portion of said gate to said gate drive output when a low current condition exists at said output of said converter.

13. A synchronous buck converter comprising a first N-channel MOSFET and a second N-channel MOSFET connected in series to a voltage supply, a gate control unit for driving a gate of each said MOSFETs, and an inductor connected to a midpoint between said first and second N-channel MOSFETs, wherein at least one of said MOSFETs comprises:

a source, a drain, a body, said gate being divided into first and second portions, said first portion having a width that is smaller than a width of said second portion, said first portion being connected to an output terminal of said gate control unit, said second portion being connected to said output terminal through a first switch, said first and second portions being electrically isolated from each other when said first switch is open.

14. The synchronous buck converter of claim 13 further comprising a charge pump, wherein said gate of the other of said MOSFETs is divided into third and fourth portions, said fourth portion having a width that is larger than a width of said third portion, said third portion being connected to an output terminal of said gate control unit, said fourth portion being connected to said charge pump through a second switch.

15. A method of reducing the power loss in a MOSFET as said MOSFET is turned repeatedly off and on, said method comprising the steps of:

fabricating a gate of said MOSFET such that said gate comprises a large portion and a small portion;

detecting an operating condition at one of the source and drain terminals of said MOSFET;

providing a gate drive signal to each of said large and small portions of said gate when said operating condition is in a first state; and providing said gate drive signal to only said small portion of said gate when said operating condition is in a second state.

16. The method of claim 15 wherein said MOSFET is included in a DC-DC converter used to convert a DC input voltage to a DC output voltage, said step of detecting an operating condition comprising detecting a level of said DC input voltage.

17. The method of claim 16 wherein said first state is a first level of said DC input voltage and said second state is a second level of said DC input voltage, said first level being higher than said second level.

18. The method of claim 15 wherein said MOSFET is included in a DC-DC converter used to convert a DC input voltage to a DC output voltage and to provide an output current, said step of detecting an operating condition comprising detecting a level of said output current.

19. The method of claim 18 wherein said first state is a first level of said output current and said second state is a second level of said output current, said second level being higher than said first level.

* * * * *